United States Patent [19]

Endo

[11] Patent Number: 5,569,390

[45] Date of Patent: Oct. 29, 1996

[54] IMAGE SENSOR HAVING A MULTI-LAYERED PRINTED CIRCUIT BOARD WITH INCREASED PARALLEL-PLATE CAPACITANCE AND METHOD FOR MANUFACTURING THE SAME

[75] Inventor: Takafumi Endo, Hyogo, Japan

[73] Assignee: Mitsubishi Denki Kabushiki Kaisha, Tokyo, Japan

[21] Appl. No.: 457,319

[22] Filed: Jun. 1, 1995

[30] Foreign Application Priority Data

Jun. 16, 1994 [JP] Japan .................................. 6-134564

[51] Int. Cl.⁶ ............................... B44C 1/22; C23F 1/00
[52] U.S. Cl. ........................... 250/208.1; 216/17; 216/20; 216/13; 361/736; 437/180
[58] Field of Search ................................. 216/13, 17, 18, 216/20, 33, 41; 358/471; 437/7, 180, 205, 209; 361/380, 395, 397, 398

[56] References Cited

U.S. PATENT DOCUMENTS

| 3,499,218 | 3/1970 | Dahlgren et al. | 216/13 X |
| 4,281,208 | 7/1981 | Kuwano et al. | 216/13 X |
| 5,041,187 | 8/1991 | Hink et al. | 216/20 X |

FOREIGN PATENT DOCUMENTS 1183257  7/1989  Japan .

OTHER PUBLICATIONS

"Multilayer Printed Wiring Board by Veer Sheet System", (Abstract) Conference & Exhibition, 23rd Internepcon Japan 94, Jan. 27, 1994, Masuo Matumoto.
"Multilayer Silver Paste Wiring Board and Manufacturing Engineering" & 1 Sheet of Drawing Figures (Figs. 1 & 2), Jisso Gijitu, 1994, Masuo Matumoto.

*Primary Examiner*—William Powell
*Attorney, Agent, or Firm*—Rothwell, Figg, Ernst & Kurz

[57] ABSTRACT

A multi-layered printed circuit board forms a base of a sensor board. Sensor chips are mounted on the multi-layered printed circuit board. The multi-layered printed circuit board is composed of a substrate, a first conductor layer, an internal insulator layer, a second conductor layer, and a surface insulator layer. An analog ground line is formed of the electrolytic copper foil of the first conductor layer by chemical etching. A signal line is formed of the electrolytic copper foil of the second conductor layer by chemical etching. Insulator layers are formed between the first conductor layer and the second conductor layer to generate a distributed capacitance between the signal line and the analog ground line for filtering out noise and improving performance.

22 Claims, 27 Drawing Sheets

IMAGE SENSOR HAVING A MULTI-LAYERED PRINTED CIRCUIT BOARD WITH INCREASED PARALLEL-PLATE CAPACITANCE AND METHOD FOR MANUFACTURING THE SAME

BACKGROUND OF THE INVENTION
Related Art 1

FIG. 18 is a sectional drawing of a conventional contact type image sensor (called CIS hereinafter) shown in a brochure published by "MITSUBISHI image sensor" (Mitsubishi Denki Kabushiki Kaisha, June 1987).

The conventional CIS of FIG. 18 comprises a light emitting diode array 1 (called LED array), a glass cover 2, an original document 3 placed on or passed over the glass cover 2, a rod lens array 4, a sensor board 5, a signal-processing circuit board 6 and a housing 7. The housing 7 encloses the LED array 1, the glass 2, the rod lens array 4, the sensor board 5 and the signal-processing circuit board 6 therein.

FIG. 19 is a block diagram of the conventional CIS.

In FIG. 19, a plurality of photoelectric conversion devices 9a to 9n and a signal circuit 5A are placed on the sensor board 5.

The signal circuit 5A is composed of shift registers and analog switches, and receives a parallel signal from the plurality of photoelectric conversion devices 9a to 9n. The plurality of photoelectric conversion devices 9a to 9n output the parallel signal depending on the shade of the original document. The signal circuit 5A converts the parallel signal to a serial signal.

The timing diagram in FIG. 20 explains operation of CIS shown in FIG. 19.

In FIG. 18, a light is generated from the light source of LED array 1, and the light is projected to the original document contacting the glass cover 2.

The reflected light depends on the shade of the original document. If an image of the original document is dark or black, the light is absorbed by it, so the reflected light does not go to the rod lens array 4.

In case that the image of the original document is light or white, the reflected light is strong, and is gathered in the rod lens array 4, and goes into the photoelectric conversion devices 9a to 9n in the sensor board 5 as an erect real image with one-to-one ratio.

Then a photoelectric current flows. The output goes to a terminal SIG of the signal-processing circuit board 6.

The voltage of the output signal is about 2 V when the original document is white. The voltage of the output signal is about 50 mV when the original document is black. Therefore, the s/n (signal/noise) ratio is about 30 dB.

In FIG. 19, n number of photoelectric conversion devices 9a to 9n are arranged side by side. Electric charges are generated at each of the photoelectric conversion devices 9a to 9n. The accumulated electric charges are converted to photoelectric currents at each of the photoelectric conversion devices 9a to 9n. An output voltage can be detected based on the level of the photoelectric current. Referring to FIGS. 19 and 20 the following is a description of how to detect the output voltage. A start pulse is input from the terminal SI, and a clock pulse is input from a terminal CLK. At the transitional timing point of the start pulse, the electric charges of each of the photoelectric conversion devices 9a to 9n flow sequentially as a photoelectric current in the signal line 6a. This photoelectric current is accumulated on the capacitor 6b of the signal-processing circuit board 6, and the output voltage is generated. This output voltage is amplified with the amplifier 6c about 10 to 20 times. The amplified voltage is output to the terminal SIG. This output voltage of the terminal SIG synchronizes with the clock pulse.

Thus, the image on the original document can be recognized by the output voltages.

FIG. 21 is a connection diagram of the sensor board 5 with sensor chips. Sensor chips 90a to 90n include the photoelectric conversion devices 9a to 9n. Each sensor chips 90a to 90n has a terminal CLK for a clock pulse and a terminal SI for a start pulse, and a terminal $V_{DD}$ for power supply and a terminal $A_{GND}$ for analog ground and a terminal SIG for signal output. The sensor board 5 is a printed-wiring board having a CLK line, a SI line, a $V_{DD}$ line (a power line), an analog ground line $l_2$, and a signal line $l_1$ on one side of the board. The terminals of the sensor chips 90a to 90n are connected with these corresponding lines as showing in FIG. 21.

FIG. 22 is a circuit diagram of the sensor chip 90a.

The sensor chip 90a has photoelectric conversion devices 9a to 9n, analog switches 11a to 11n, analog switches 10a to 10n, analog switch 12, flip-flops 13a to 13n, and AND gates G1 to Gn.

In FIG. 22, each of the photoelectric conversion devices 9a to 9n includes a transistor for current amplification and an electric charge accumulation part shown as a capacitor. The electric charge accumulation part accumulates the electric charges which are converted from light.

The analog switches 11a to 11n switch the signal of the photoelectric conversion devices 9a to 9n into the signal line $L_1$ connected to the terminal SIG. The analog switches 10a to 10n discharge the unnecessary electric charges of the photoelectric conversion devices 9a to 9n. The analog switch 12 changes to "ON" at the positive-going edge of the clock pulse. The flip-flops 13a to 13n control each of the analog switches 10a to 10n and 11a to 11n with the clock pulse.

The operation of the circuit in FIG. 22 will be described below referring to the timing diagram in FIG. 23.

The start pulse from the terminal SI is input to the flip-flop 13a. This start pulse is synchronized with the clock pulse. The clock pulse is supplied to all flip-flops 13a to 13n from terminal CLK (CLOCK). The start pulse is shifted from the flip-flop 13a to the flip-flops 13b, 13c, . . . , 13n. In each timing point of shifting the start pulse from the flip-flop 13a to 13n, the electric charges of each of the photoelectric conversion devices 9a to 9n flow in the signal line $L_1$ as photoelectric current. The voltage of this current corresponds to the amount of the electric charges.

As showing in FIG. 23, when the start pulse is entered to the D input in the flip-flop 13a, the Q1 output goes from "L" (LOW signal) to "H" (HIGH signal). The analog switch 11a changes to "ON" because the AND gate G1 goes "H". Then the electric charges of the photoelectric conversion device 9a flow to the signal line $L_1$.

The next clock pulse is input to the AND gate G1. The analog switch 11a returns to "OFF" because the AND gate G1 changes to "L" at the positive-going edge of the next clock pulse. At this point, the signal line $L_1$ is reset.

The Q2 output goes from "L" to "H" at the timing of the negative-going edge of the Q1 output. The analog switch 10a changes to "ON" by the complementary Q2 (not Q2) output. Therefore, the remaining electric charges in the photoelectric conversion device 9a are discharged to an analog ground line $L_2$.

At the same time the analog switch 11b changes to "ON" because the Q2 output is "H". Then the electric charges in the photoelectric conversion device 9b flow in the signal line $L_1$. Such operation continues as the start pulse is transmitted to the flip-flops in order.

The conventional contact type image sensor is composed as described above. In CIS, it is important that the output voltage which is generated by scanning a black image on the original document is low. The output voltage which is generated by scanning a black image is similar in magnitude to the output voltage generated by the dark current. Therefore, the output voltage is measured with respect to the voltage generated by the dark current. Hereinafter, "idling voltage" means the output voltage which is generated by dark current.

FIG. 24 shows an idling voltage measured using one sensor chip 90a. FIG. 25 shows an idling voltage measured using a conventional CIS which contains a plurality of sensor chips 90a to 90n.

The idling voltage Vd is measured at the output of the terminal SIG. The idling voltage measured in this case is based on the waveform of an oscilloscope. In FIGS. 24 and 25, the horizontal axis indicates the position of the photoelectric conversion devices. The vertical axis indicates the idling voltage.

As shown in FIG. 24 the idling voltage is not equal between adjacent photoelectric conversion devices.

As shown in FIG. 25, the idling voltage has a large fluctuation in the case where the photoelectric conversion devices are arranged in a long line on the sensor board 5.

As describe above, here are thus two problems.

(1) The idling voltage is not equal between adjacent photoelectric conversion devices.

(2) In case of arranging the photoelectric conversion devices in a long line, the idling voltage has a large fluctuation.

The reason is that unnecessary electric charges are accumulated in the signal line $L_1$.

Related Art 2.

A contact type image sensor which eliminates above problems is shown in unexamined Japanese patent application HEI1-183257.

FIG. 26 is a circuit diagram of a sensor chip 100a. In FIG. 26, a plurality of analog switches 15a to 15n are added to the circuit shown in FIG. 22. These analog switches 15a to 15n control the timing point of discharge for the unnecessary electric charge which remains on the signal line $L_1$. The signal line $L_1$ is connected with terminal SIG. The analog ground line $L_2$ is connected with terminal $A_{GND}$. A plurality of lines are connected to the signal line $L_1$ and the analog ground line $L_2$. These lines correspond to the photoelectric conversion devices 9a to 9n. The analog switches 15a to 15n are arranged every line.

FIG. 27 illustrates a timing diagram of the output in the terminal SIG and the analog switches 15a to 15n. As shown in FIG. 27, each of the analog switches 15a to 15n changes its states between 'ON' and 'OFF' synchronous with the clock pulses. The analog switches 15a to 15n changes to "ON" at the positive-going edge of the clock pulse. Then the signal line $L_1$ is connected to the analog ground line $L_2$ by the analog switches 15a to 15n. As shown in FIG. 27, the output of the terminal SIG should go to "0" volt in theory when the analog switches 15a to 15n are "ON". Thus, the analog switches 15a to 15n discharge the unnecessary electric charge which remains on the signal line $L_1$.

The following is the reason why a plurality of analog switches 15a to 15n are arranged corresponding to the photoelectric conversion devices 9a to 9n, which connect the signal line $L_1$ and the analog ground line $L_2$. The electric charges, generating from the photoelectric conversion devices 9a to 9n, flow in the signal line $L_1$ as a photoelectric current. The relations between the voltage $V_P$ which generates in the signal line $L_1$ and the photoelectric current $i_p$ are expressed by the following formula:

$$V_P = K(h_{fe} \times i_p \times t_s)/(C_S + C_L) \qquad (1)$$

$V_P$: voltage $i_p$: photoelectric current $h_{fe}$: current amplification factor of the photo-transistor $t_s$: storage time $C_S$: stray capacitance $C_L$: capacitance K: constant The stray capacitances $C_S$ are distributed at various places between the signal line $L_1$ and the analog ground line $L_2$, as shown in FIG. 28. So, even though only one analog switch is arranged between the signal line $L_1$ and the analog ground line $L_2$, the unnecessary electric charge caused by these stray capacitances $C_S$ can not be removed completely when the signal line $L_1$ is reset. In order to remove the influence of these stray capacitances $C_S$, a plurality of analog switches 15a to 15n are arranged in a plurality of lines between the signal line $L_1$ and the analog ground line $L_2$ as shown in FIG. 26.

FIG. 29 is a block diagram of the sensor board 5. There are a plurality of sensor chips 100a to 100n, and a plurality of analog switches 150a to 150n. The analog switches 150a to 150n are arranged on the sensor board 5. On the other hand, the analog switches 15a to 15n are arranged in each of the sensor chips 100a to 100n. A signal line $l_1$ and an analog ground line $l_2$ are arranged on the sensor board 5. As shown in FIG. 26, a capital letter 'L' is used for indicating lines within a sensor chip, such as signal line $L_1$ and analog ground line $L_2$. On the other hand, a small letter 'l' is used for indicating lines on a sensor board, i.e. outside of the sensor chip, such as signal line $l_1$ and analog ground line $l_2$. The signal line $l_1$ is connected with each sensor chips 100a to 100n and terminal SIG of the sensor board 5. An analog ground line $l_2$ is connected with terminal $A_{GND}$ of the sensor board 5. There are a plurality of analog switches 150a to 150n between the signal line $l_1$ and the analog ground line $l_2$. These analog switches 150a to 150n control the timing point of discharge for the unnecessary electric charge which remains on the signal line $l_1$.

SUMMARY OF THE INVENTION

To solve the above and other problems, one object of this invention is to provide an image sensor having a printed circuit board with increased parallel-plate capacitance which can stabilize and reduce the idling voltages of the sensor board. The second object is to provide the image sensor which can equalize equal the idling voltages at adjacent photoelectric conversion devices.

According to one aspect of the invention, an image sensor includes:

a plurality of sensor chips for sensing an image and outputting a signal to form a part of a parallel signal, wherein each of the sensor chips has a plurality of photoelectric conversion devices, an internal signal line coupled to the plurality of photoelectric conversion devices, an internal ground line coupled to the plurality of photoelectric conversion devices and a plurality of switches for coupling the signal line and the ground line;

a printed circuit board for mounting the plurality of sensor chips thereon and for forming a signal circuit wherein the signal circuit receives the parallel signal from the plurality of sensor chips, converts the parallel signal to a serial signal, and outputs the serial signal;

wherein the printed circuit board has a substrate as a base, a first conductor layer placed on one side of the substrate, having an external ground line coupled to the internal signal line, a second conductor layer having an external signal line coupled to the internal signal line, and an insulator layer between the first and the second conductor layers for creating a capacitance between the external signal line and the external ground line.

According to another aspect of the invention, a multi-layered printed circuit board includes:

a substrate;

a first conductor layer placed on one side of the substrate for providing a ground;

a second conductor layer for providing a signal line;

an insulator layer located between the first and the second conductor layers for creating a capacitance between the signal line and the ground;

a surface insulator layer; and a circuit mounted on the surface insulator layer having a plurality of chips electrically coupled to the signal line and the ground.

According to another aspect of the invention, a method for manufacturing a board includes the steps of:

forming a first conductor layer;

forming a ground on the first conductor layer by chemical etching;

forming an internal insulator layer next to the first conductor layer;

forming a second conductor layer next to the insulator layer;

forming a signal line on the second conduct layer by chemical etching;

forming a surface insulator layer next to the second conductor layer;

mounting chips on the surface insulator layer; and electrically coupling the chips to the signal line and ground.

Other objects features, and advantages of the invention will be apparent from the following description when taken in conjunction with the accompanying drawings.

DESCRIPTION OF THE PREFERRED EMBODIMENTS

Embodiment 1

This embodiment comprises a CIS which has a large distributed capacitance generated between a signal line and an analog ground line which is attained by using a multi-layered printed circuit board for a sensor board in accordance with the present invention.

Figure 1:
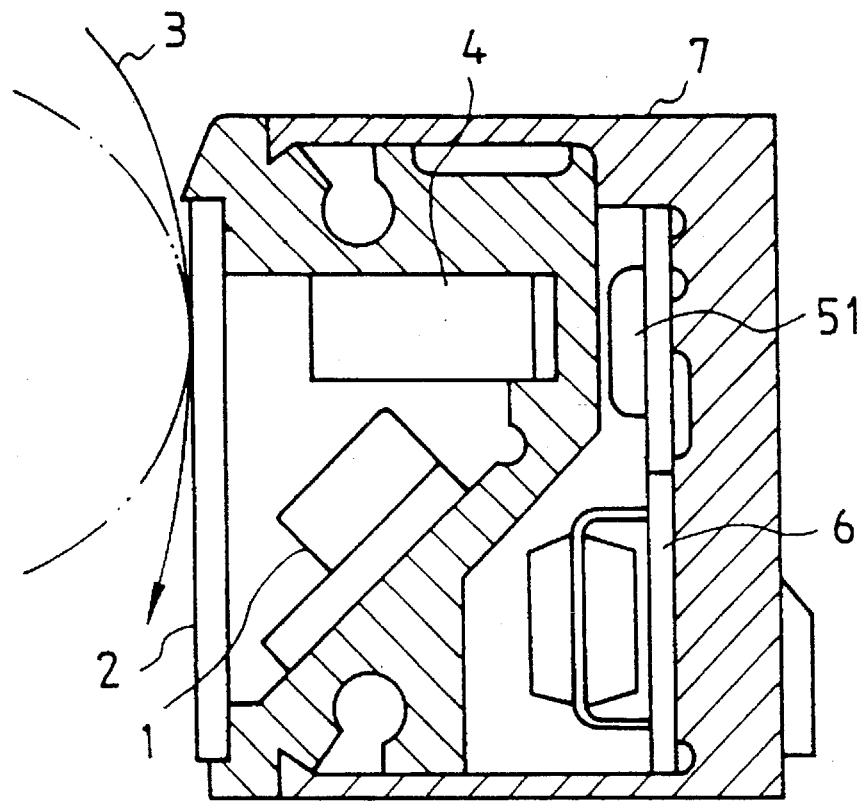
FIG. 1 illustrates a sectional drawing of a CIS in embodiment 1 of the present invention.
Figure 18:
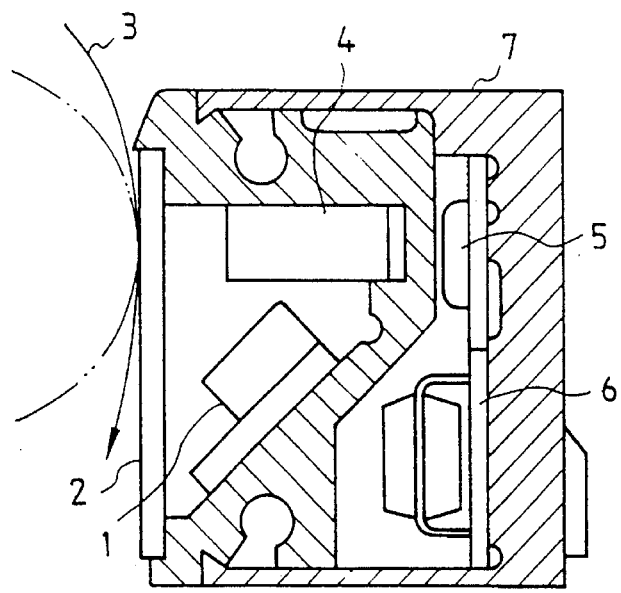
FIG. 18 illustrates a sectional drawing of the conventional CIS of the prior art.

FIG. 1 is a sectional drawing of the CIS. In FIG. 1, the sensor board 50 replaces the sensor board 5 shown in FIG. 18 of the related art. Similar reference numbers indicate similar elements, so explanations for them are omitted.

Figure 26:
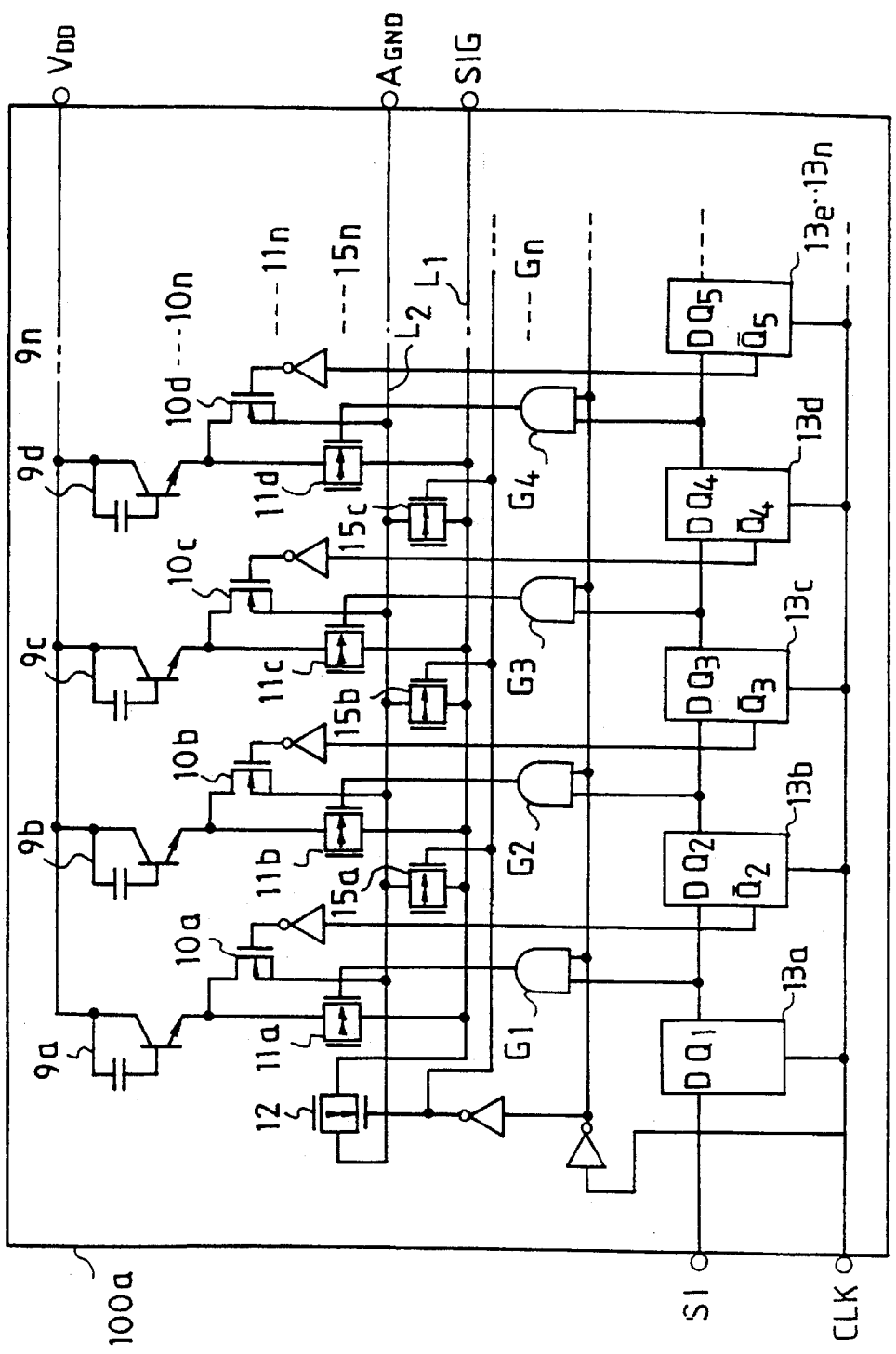
FIG. 26 illustrates a circuit diagram of a sensor chip of the prior art.
Figure 27:
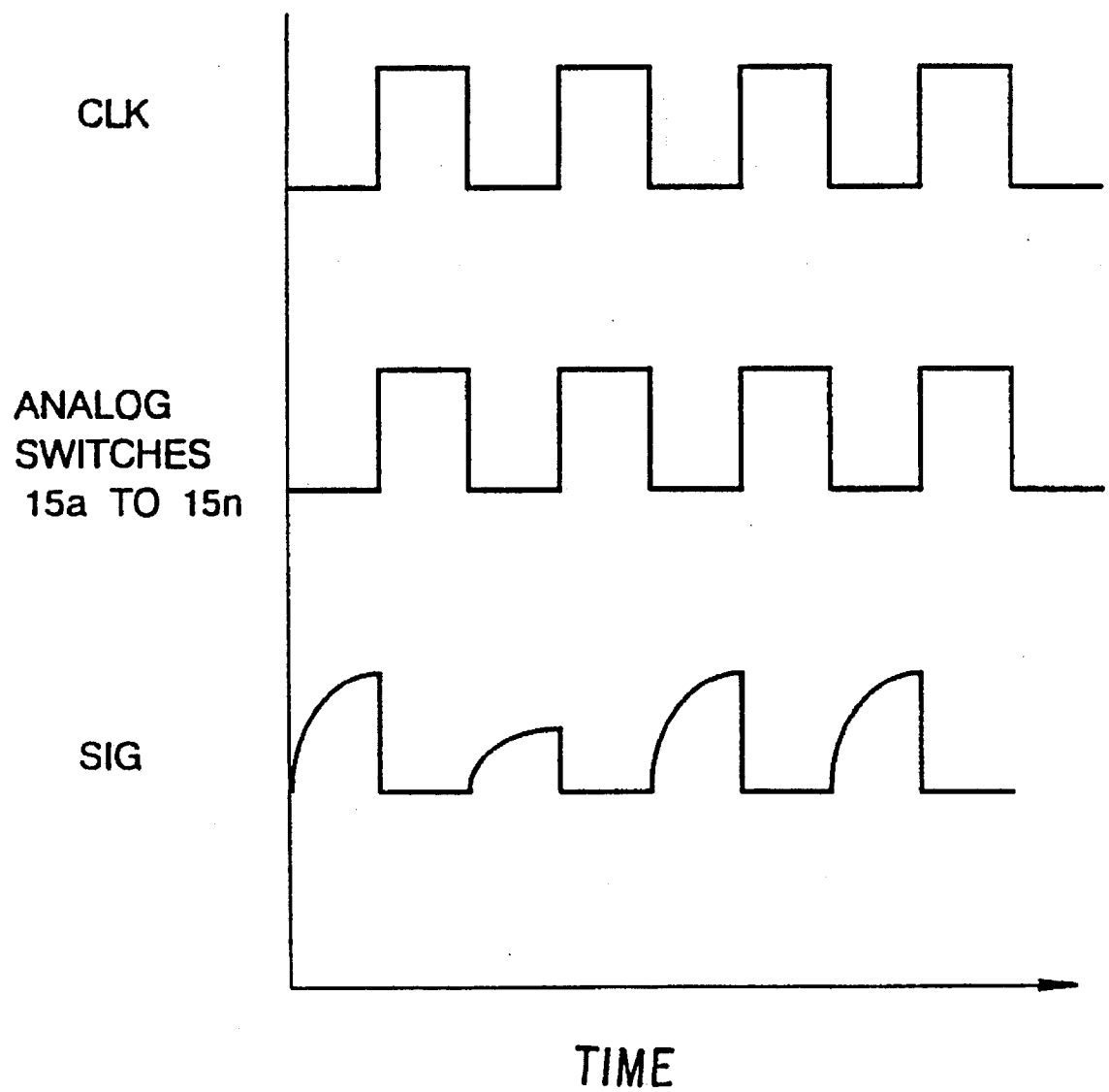
FIG. 27 illustrates a timing diagram of the output at the signal terminal of a prior art CIS.
Figure 28:
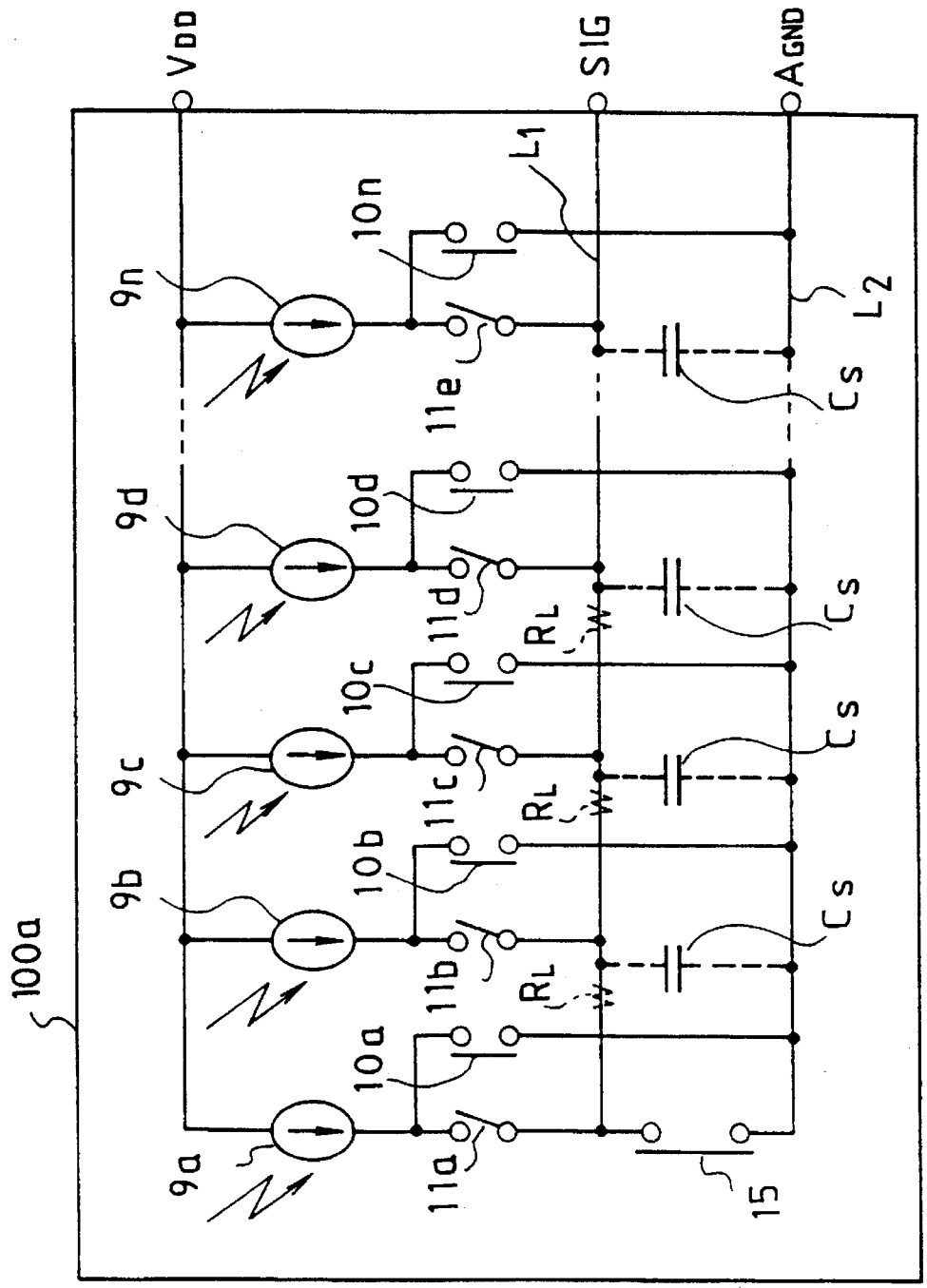
FIG. 28 is a diagram illustrating the stray capacitance of the prior art CIS.
Figure 29:
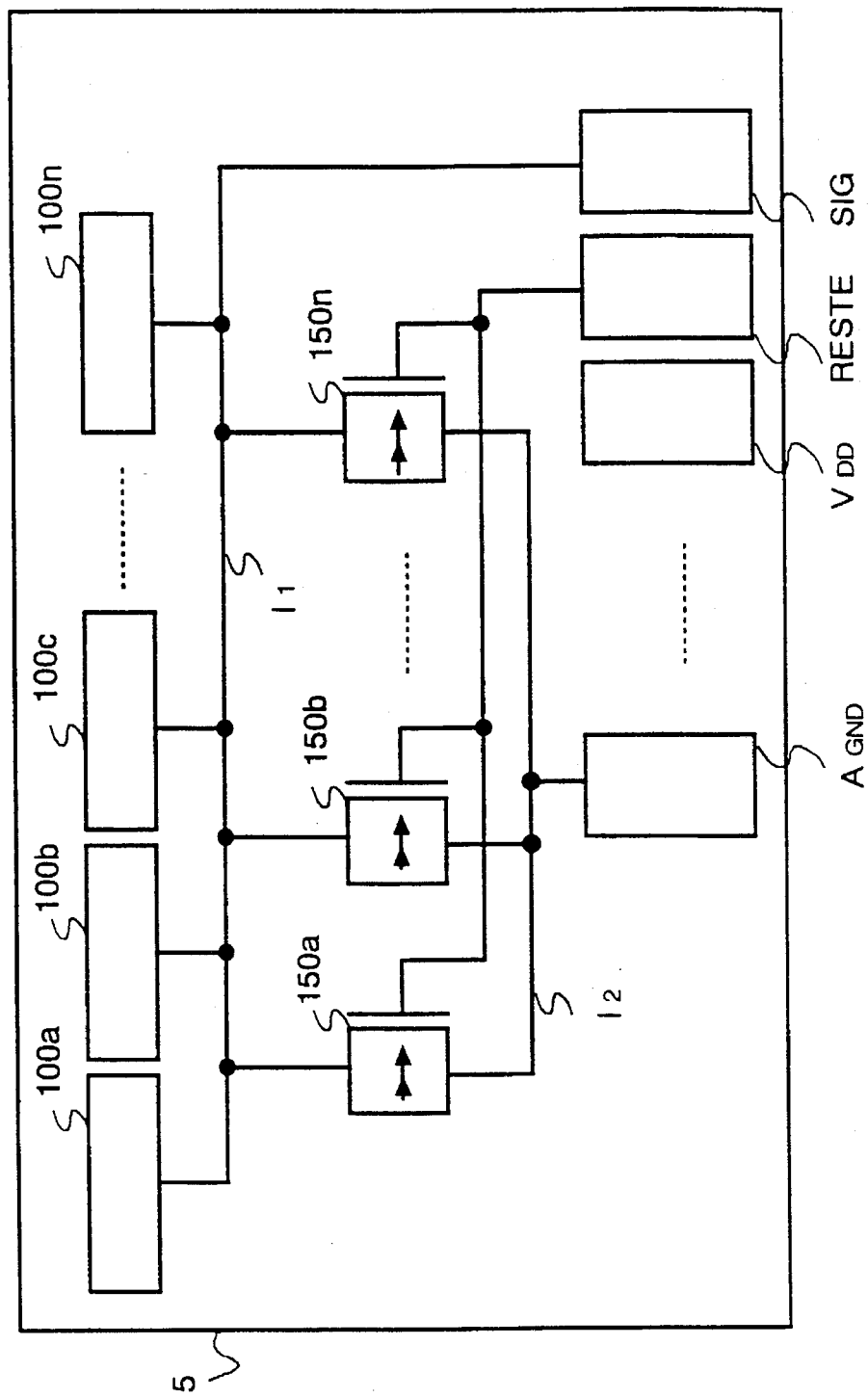
FIG. 29 is a block diagram on a sensor board showing a plurality of switches 150a to 150n for removing the unnecessary electric charges of the prior art CIS.

A plurality of sensor chips 100a to 100n are placed on the sensor board 50. FIG. 26 of the related art shows a circuit diagram of the sensor chip 100a of this embodiment and the operations are the same in this respect as the related arts. Noise is generated in the signal line $L_1$ by analog switches 15a to 15n, 11a to 11n, 10a to 10n and the pulse signals of CLK and SI signals. To eliminate this high-frequency noise, the present invention uses a multi-layered printed circuit board for the sensor board 50.

The following is a further description of the noise with reference to FIG. 26. When the analog switches 15a to 15n are "OFF", the impedance of the signal line $L_1$ is high. When the analog switches 15a to 15n, 11a to 11n and 10a to 10n operate, noise is generated in the signal line $L_1$. The noise is also generated by pulse signals which are input from the terminal CLK and from the terminal SI. Even though the level of the noise may be quite small, the level of the noise is also amplified when the signal is amplified. Each of the sensor chips 100a to 100n adds to the noise and outputs the noise from the sensor chip through the signal line $L_1$. Then the noise is accumulated In the signal line $l_1$ from the plurality of the sensor chips 100a to 100n. As described, the noise occurs in the signal line $L_1$ within sensor chips 100a to 100n. Each of the signal lines $L_1$ within the sensor chips 100a to 100n is connected with the signal line $l_1$ in the sensor board 50. So the noise which occurs within the sensor chips 100a to 100n goes into the signal line $l_1$ in the sensor board 50. This noise makes the idling voltage higher.

To prevent the above noise, it is desirable to have a high capacitance between the signal line $l_1$ and the analog ground line $l_2$. This capacitance functions to remove high-frequency noise.

It is common to use a printed-wiring board or ceramic plate board for a sensor board.

The application of the present invention to a printed-wiring board for generating increased parallel-plate capacitance will be described below with reference to FIGS. 2–4.

In the case of the printed-wiring board, both sides of the board are used for printing. If the signal line $l_1$ is arranged on one side of the board and the analog ground line $l_2$ is arranged on the other side, a parallel-plate capacitance between the signal line $l_1$ and the analog ground line $l_2$ can be generated. In the prior art, both of the signal line and the analog ground line are placed on one side of the printing-wiring board, so there is no parallel-plate capacitance between these lines.

Now, physical factors for a parallel-plate capacitor are summarized by the formula:

$$C = K_1 \times \epsilon \gamma \times s/d \qquad (2)$$

C: parallel-plate capacitance
$\epsilon \gamma$: relative permittivity of the board
$k_1$: constant
d: distance between plates
s: facing area of either plate In this case, the distance between the plates is the thickness of the printed-wiring board. The thinner the printed-wiring board, the greater the parallel-plate capacitance (distributed capacitance). But the thickness of the board is limited to a minimum of about 0.3 mm. So the amount by which the distributed capacitance of the printed-wiring board can be increased is limited.

The thickness of the ceramic plate board is limited to a minimum of about 0.3 mm. So the amount by which the distributed capacitance of the ceramic plate board can be increased is limited. Accordingly, the typical printed-wiring board or the ceramic plate board dose not permit the generation of enough distributed capacitance for removing high-frequency noise.

To remove this high-frequency noise, the present invention uses a multi-layered printed circuit board 16 in a sensor board 50.

Figure 2:
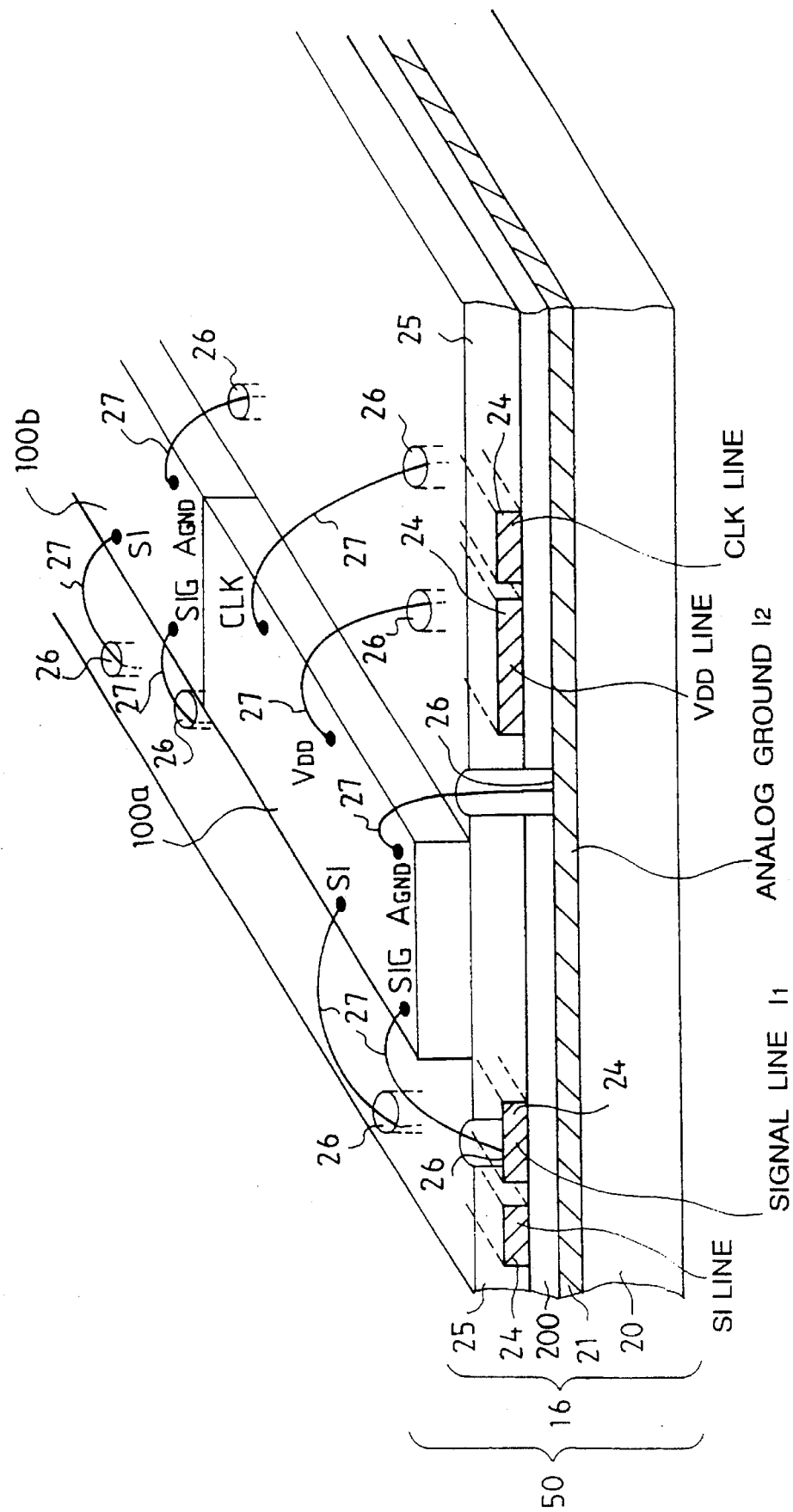
FIG. 2 illustrates a sectional and perspective view of the sensor board of the embodiment of FIG. 1 which generates a higher capacitance to decrease the idling voltage.

FIG. 2 shows a sectional and perspective view of the sensor board 50. A multi-layered printed circuit board 16 is the base of the sensor board 50. The multi-layered printed circuit board 16 is composed of a substrate 20, a first conductor layer 21, an internal insulator layer 200, a second conductor layer 24, and a surface insulator layer 25. Sensor chips 100a to 100n are placed on the multi-layered printed circuit board 16.

Figure 3:
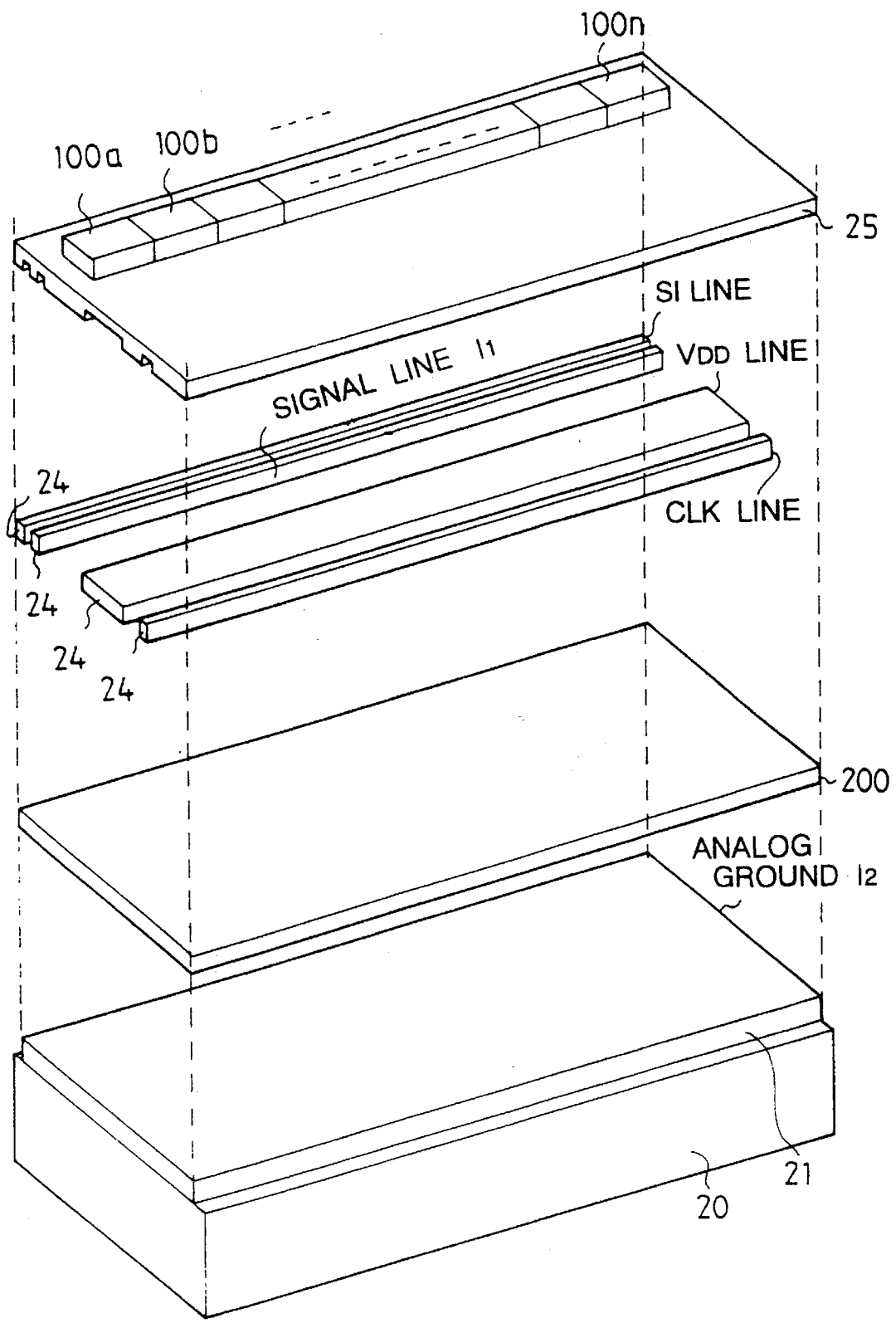
FIG. 3 illustrates a exploded view of the sensor board of the embodiment of FIG. 2.

FIG. 3 is a exploded view of the sensor board 50.

Figure 4:
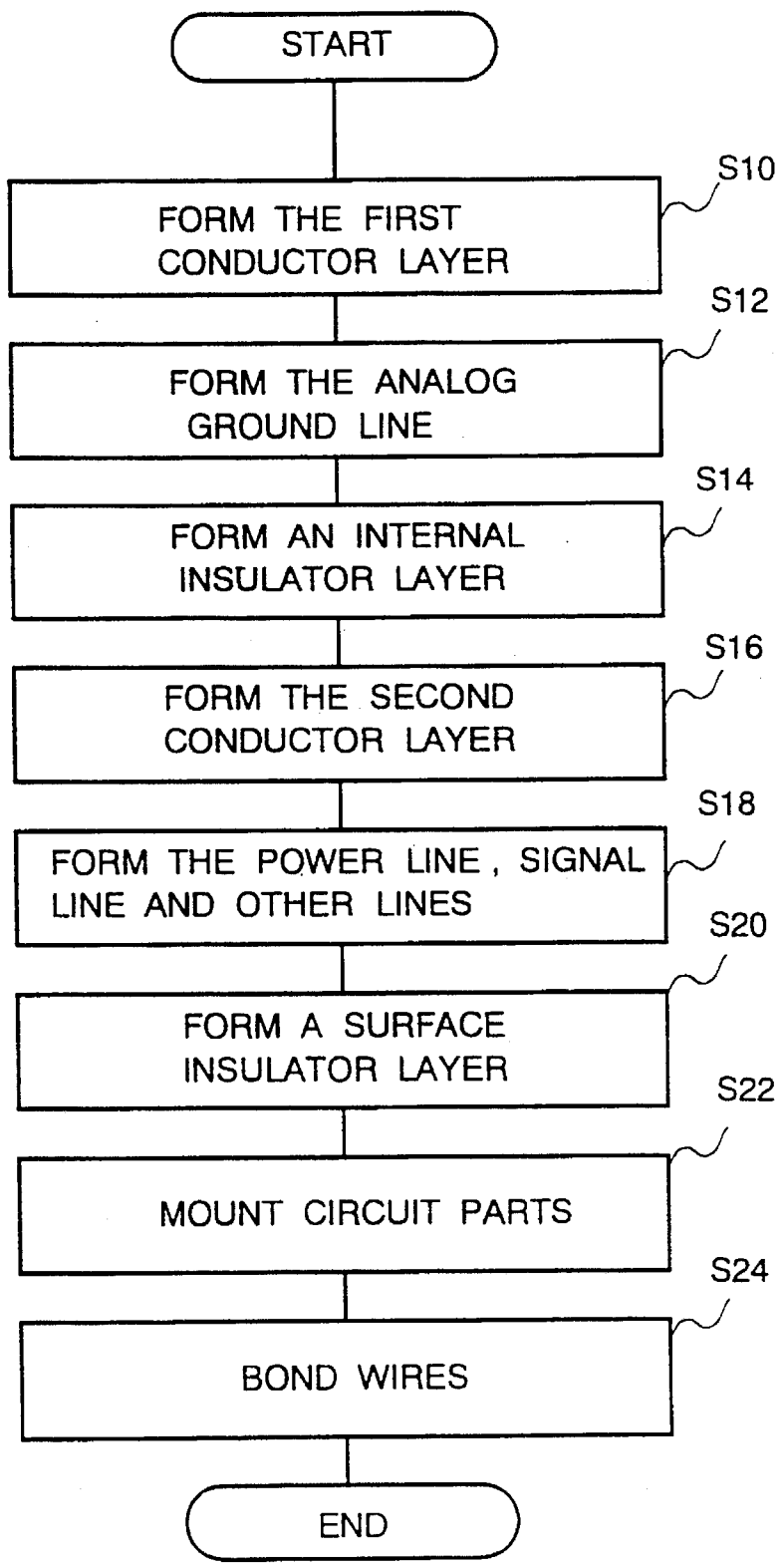
FIG. 4 is a flow diagram for a method of making the sensor board pursuant to the present invention.

FIG. 4 is a flow diagram illustrating the method of making the sensor board 50 in accordance with the present invention.

In step S10, the first conductor layer 21 is formed on the substrate 20. The first conductor layer 21 is preferably formed of electrolytic copper foil.

In step S12, the analog ground line $l_2$ is formed. The analog ground line $l_2$ is formed of electrolytic copper foil of the first conductor layer 21. The analog ground line $l_2$ extends over almost whole area of the first conductor layer 21 or a little bit smaller area than the whole area. The analog ground $l_2$ is formed of electrolytic copper foil by chemical etching. The analog ground line $l_2$ can extends over the whole area or only a partial area of the first conductor layer 21. If the analog ground line $l_2$ extends over a partial area of the first conductor layer 21, the partial area has to be a facing area to the signal line $l_1$ and the power line (called the $V_{DD}$ line).

In step S14, the internal insulator layer 200 is formed next on the first conductor layer 21. The internal insulator layer 200 is formed of a resin having about 10 μm thickness.

In step S16, the second conductor layer 24 is formed next on the internal insulator layer 200. The second conductor layer 24 is also preferably formed of electrolytic copper foil.

In step S18, the CLK line, the signal line $l_1$, $V_{DD}$ line (the power line) and the SI line are formed of the second conductor layer 24. These lines are formed of electrolytic copper foil and are formed by chemical etching of the second conductor layer 24. In FIGS. 2 and 3, the position of the lines is shown only as one example. For example the SI line and the CLK line are changeable their position and other lines are also changeable.

In step S20, a surface insulator layer 25 is formed next to the second conductor layer 24. The surface insulator layer 25 is an insulator layer which is formed by coating with a solder-resist for surface protection.

In step S22, circuit parts are mounted on the surface insulator layer 25. Lands 26 as shown in FIG. 2 form areas for wire-bonding to the first conductor layer 21 or to the second conductor layer 24. The surface of the lands 26 are treated by being electroplating with a soft-gold-material.

The lands 26 are formed with holes to the second conductor layer 24 through the surface insulator layer 25 as shown in FIG. 2. The lands 26 have holes to the first conductor layer 21 through the surface insulator layer 25, the second conductor layer 24 and internal insulator layer 200 as shown in FIG. 2. Sensor chips 100a to 100n are mounted on the surface insulator layer 25. Other circuit parts such as capacitances and resistances can be mounted on the surface insulator layer 25 if necessary.

In step S24, wire bonding is performed. Gold wire 27 connects the lands 26 and each of the pads on the terminals on the sensor chips 100a to 100n.

The sensor chips 100a to 100n are mounted on the multi-layered printed circuit board 16 to form the completed sensor board 50.

The thickness of the internal insulator layer 200 is about 10 μm.

Figure 5:
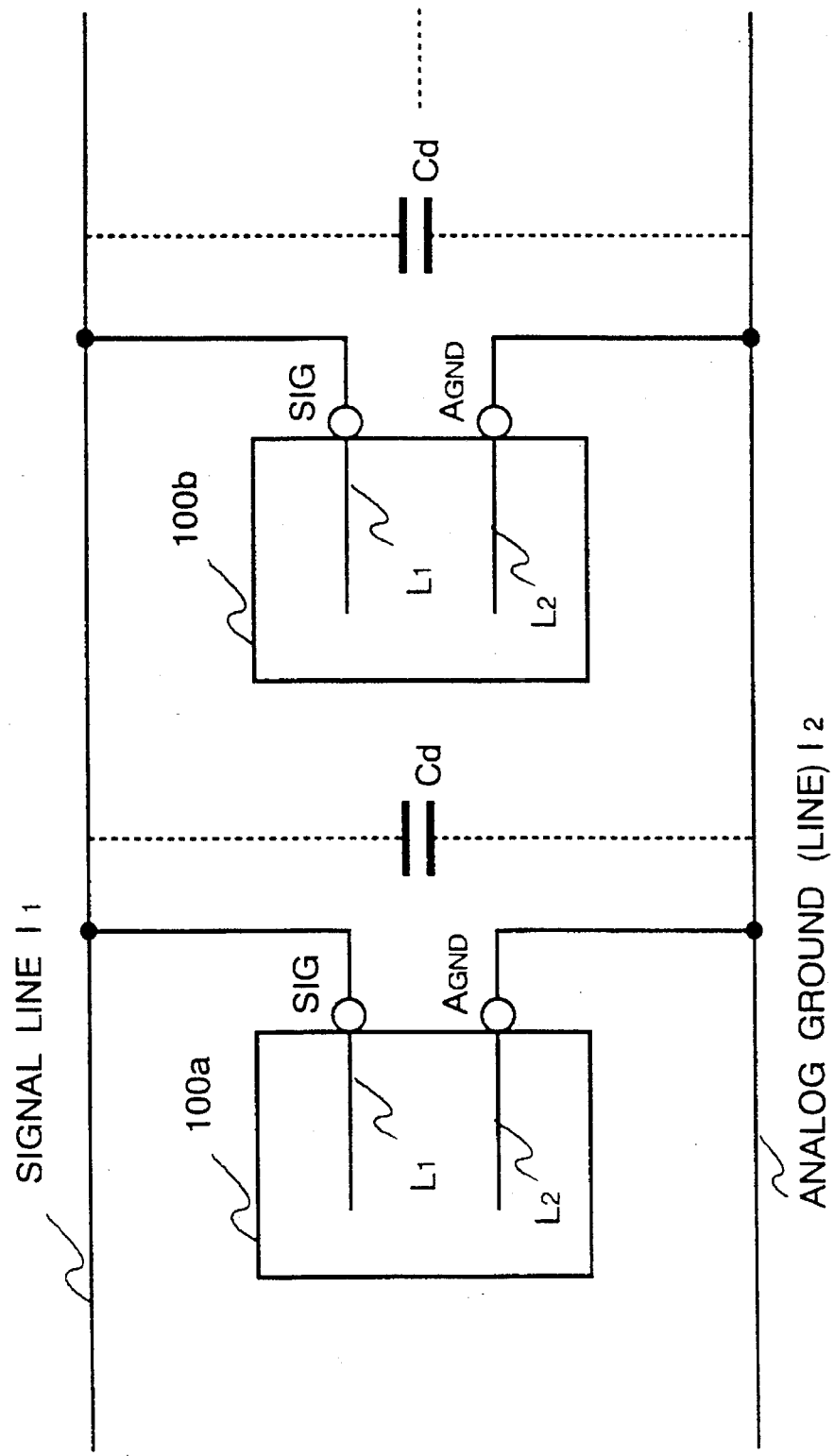
FIG. 5 illustrates a schematic block diagram of the embodiment of the present invention which means that the internal high-frequency noise generated in the sensor chips is absorbed by the external distributed capacitance generated by the external signal line and the external analog ground line.

FIG. 5 is a schematic block diagram of this invention. The analog ground $l_2$ is placed in the first conductor layer 21, and the signal line $l_1$ is placed in the second conductor layer 24. There is internal insulator layer 200 between the first conductor layer 21 and the second conductor layer 24, so a distributed capacitance Cd is generated between these lines $l_1$, $l_2$.

The noise is generated in the signal line $L_1$ within sensor chips 100a to 100n. Each the signal lines $L_1$ within the sensor chips 100a to 100n is connected with the signal line $l_1$ in the sensor board 50. So the noise generated within the sensor chips 100a to 100n goes into the signal line $l_1$ in the sensor board 50. However, the distributed capacitance Cd functions to remove the noise in the signal line $l_1$. This means that the noise which is generated within the sensor chips 100a to 100n is eliminated by the distributed capacitance Cd which is generated by the multi-layered printed circuit board of this invention.

According to this invention, the internal high-frequency noise generated in the sensor chips 100a to 100n is absorbed-by the distributed capacitance Cd between the signal line and the analog ground line on the sensor board 50. The capacity of the distributed capacitance Cd is large enough to absorb the high-frequency noise because the thickness of the internal insulator layer 200 is very small.

Embodiment 2

This embodiment comprises a CIS which has a large distributed capacitance generated between a signal line and an analog ground which is attained by using a multi-layered printed circuit board for a sensor board in accordance with the present invention. Performance measurements on this embodiment are also set forth.

Figure 6:
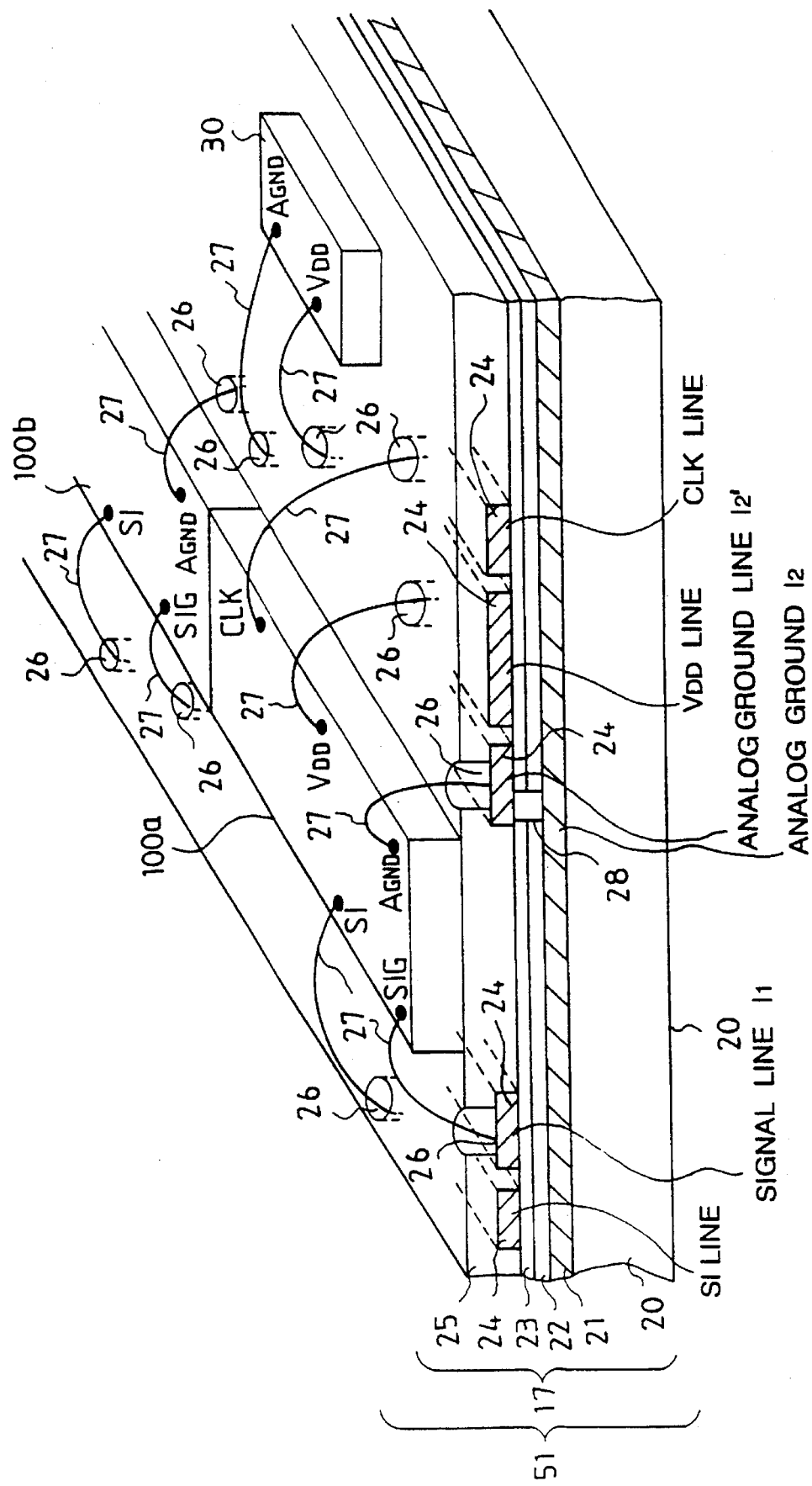
FIG. 6 illustrates a further sectional and perspective view of the sensor board of another embodiment.

FIG. 6 is a sectional and perspective view of the sensor board 51 of this embodiment.

Figure 7:
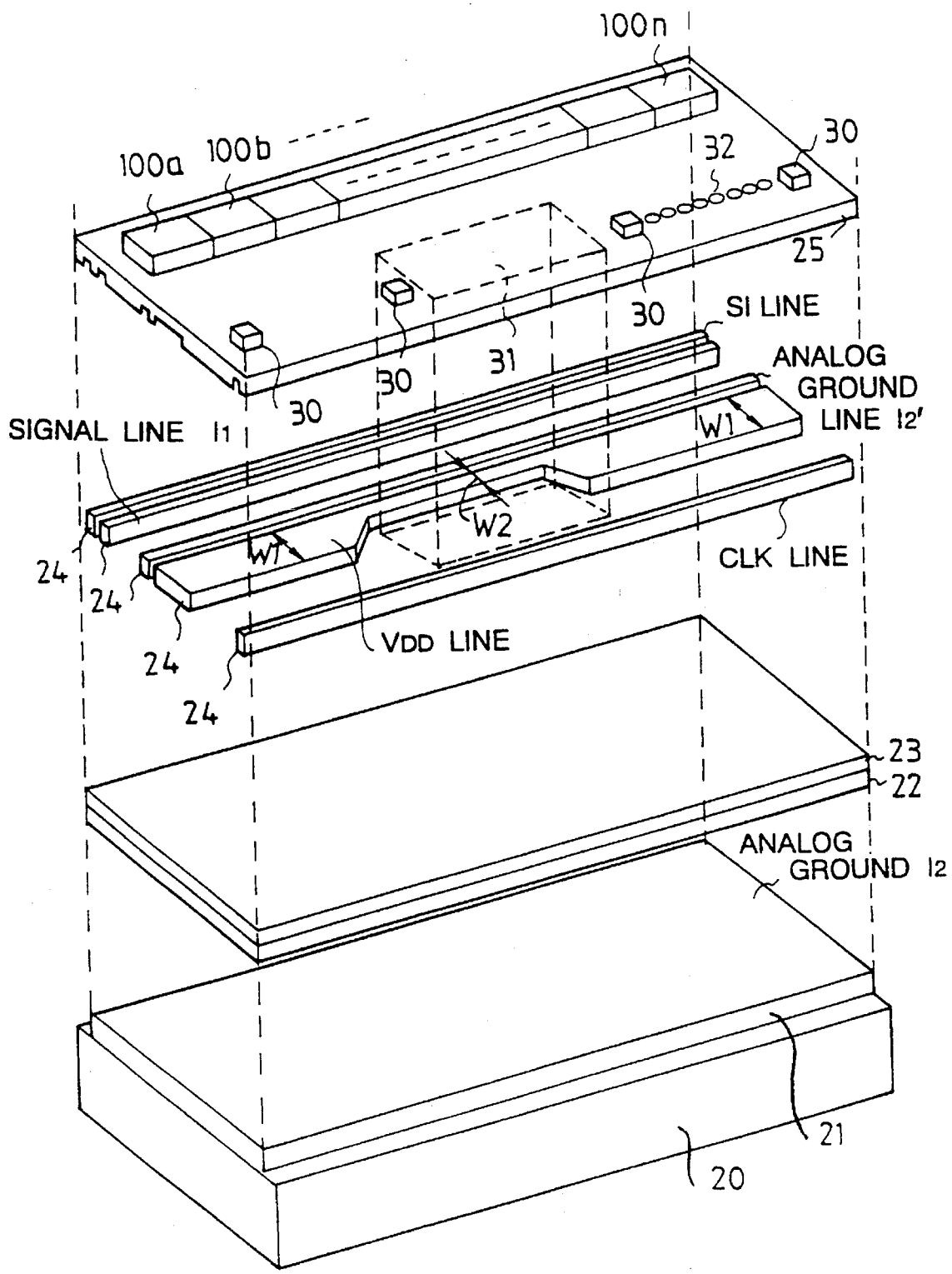
FIG. 7 illustrates a exploded view of the sensor board of the embodiment of FIG. 6.

FIG. 7 is an exploded view of the sensor board 51.

The difference between FIG. 6 and FIG. 2 will be described below referring to the FIGS. 6 and 7. Similar reference numbers indicate similar elements, so explanations for them are omitted.

Figure 19:
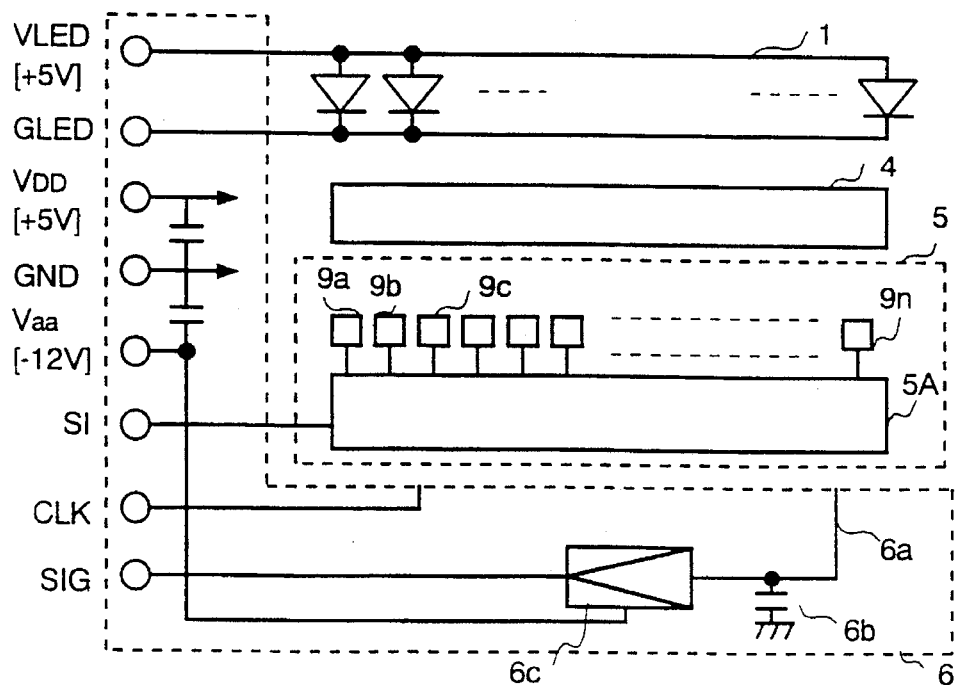
FIG. 19 illustrates a block diagram of the conventional CIS of the prior art.
Figure 20:
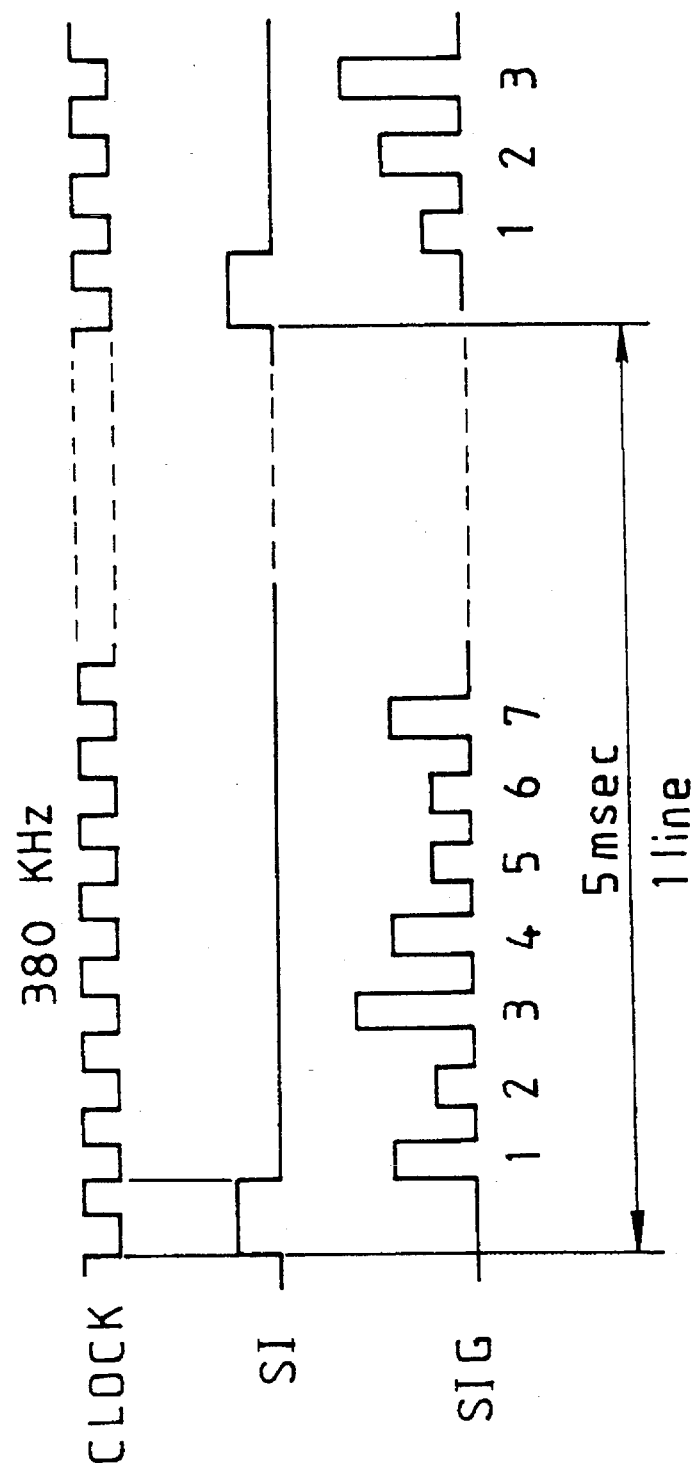
FIG. 20 illustrates a timing diagram of the conventional CIS of the prior art.
Figure 21:
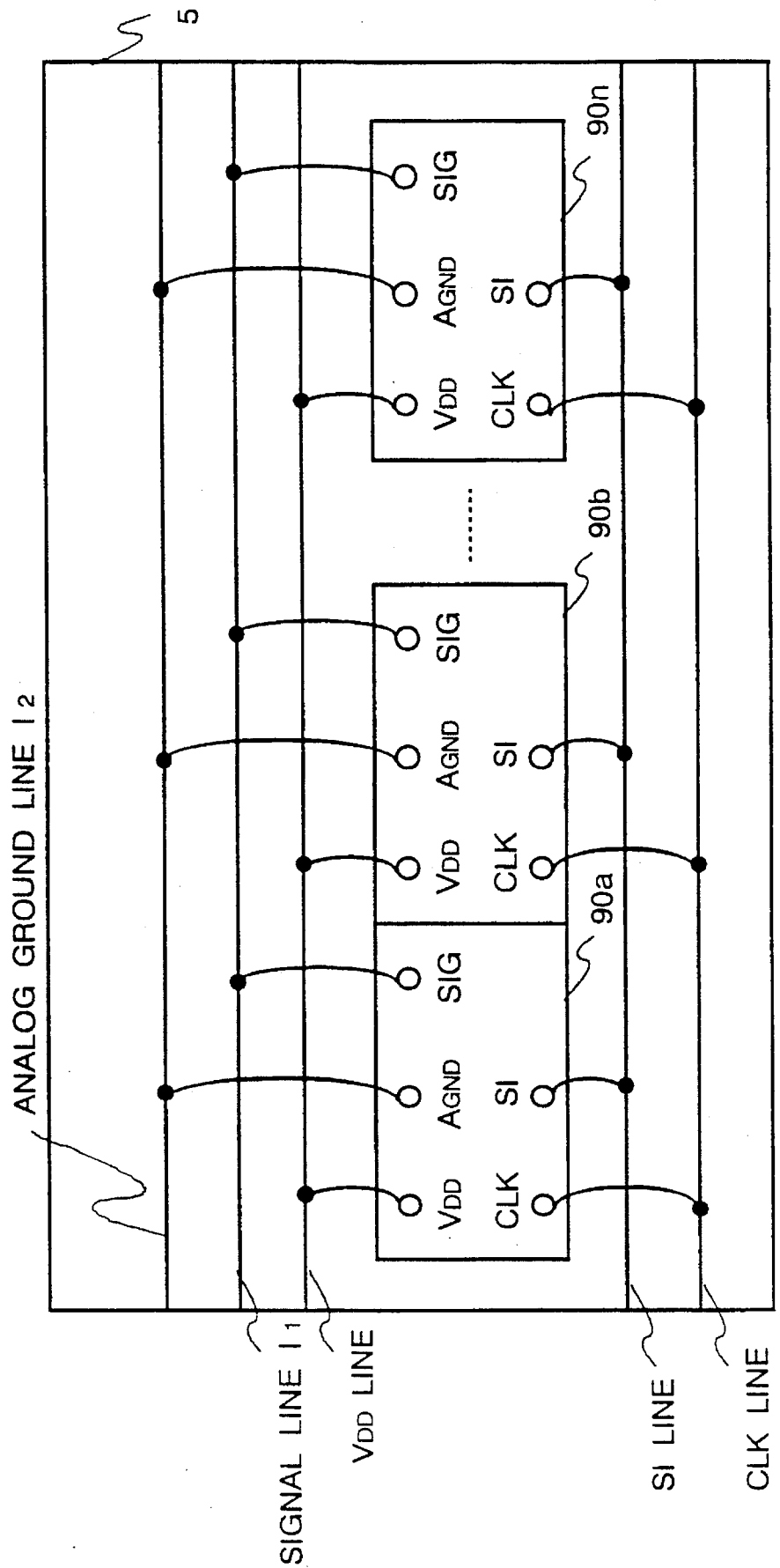
FIG. 21 illustrates a connection diagram of the sensor board with sensor chips of the prior art.
Figure 22:
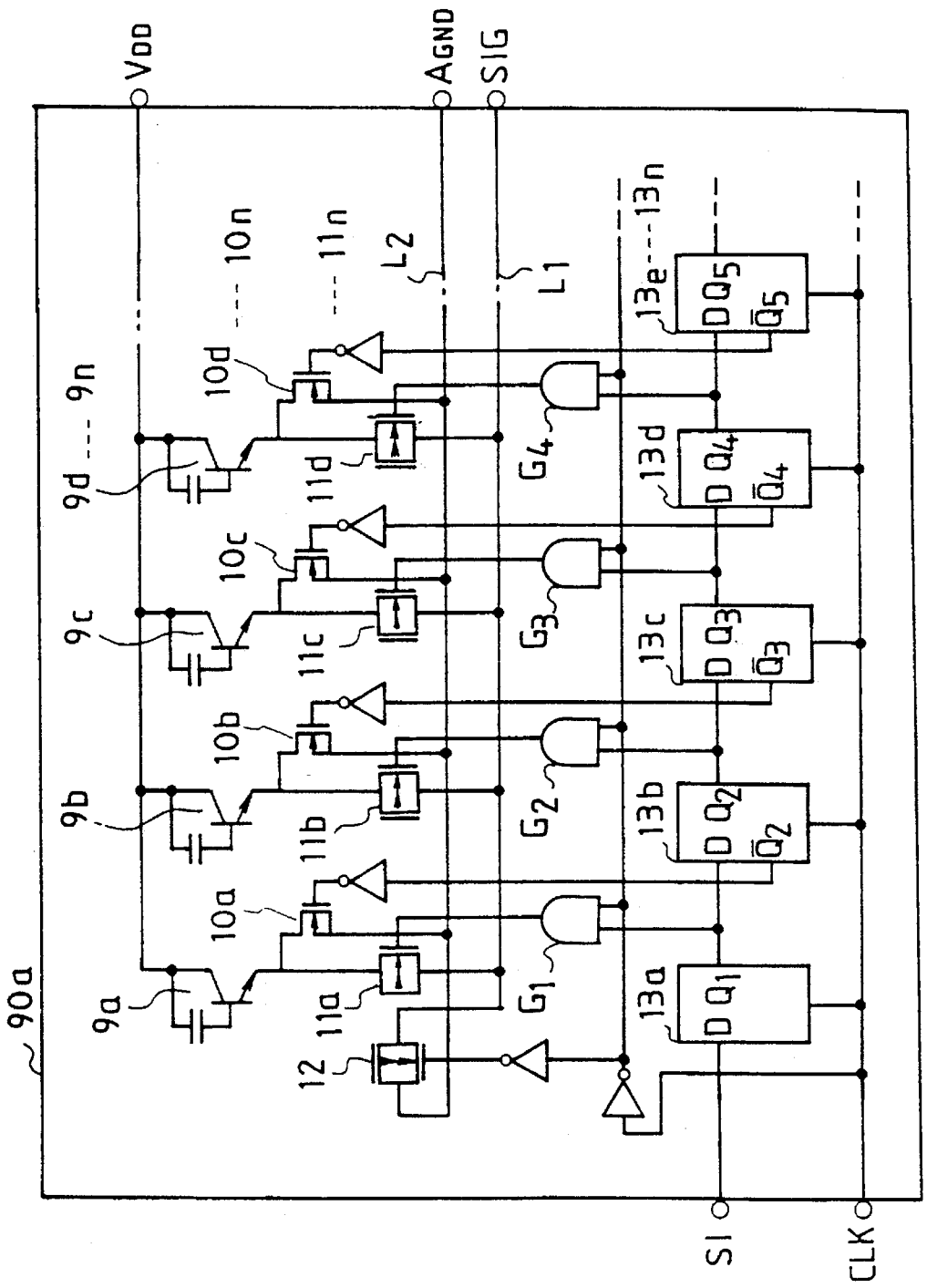
FIG. 22 illustrates a circuit diagram of the sensor chip of the prior art.
Figure 23:
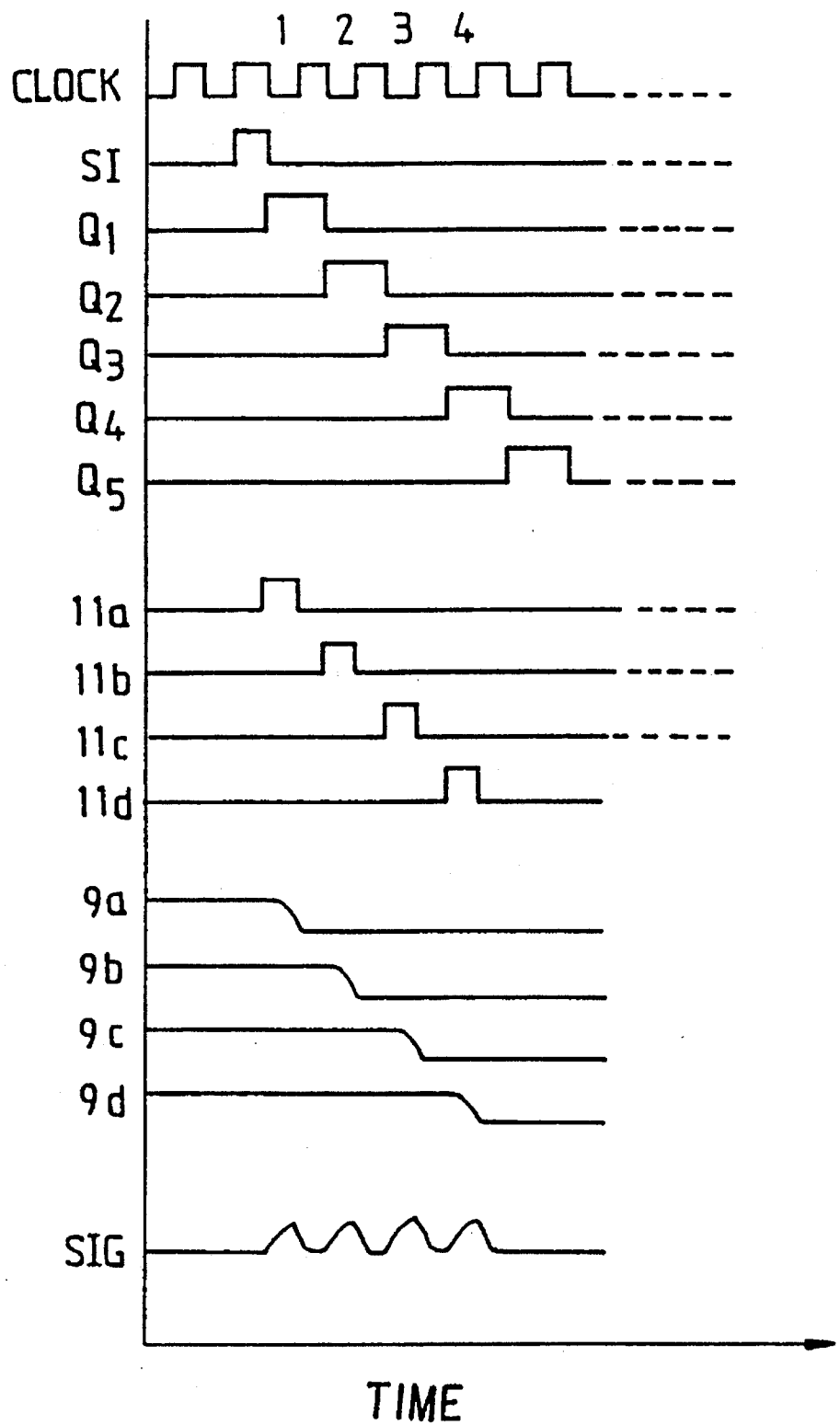
FIG. 23 illustrates a timing diagram of the circuit of FIG. 22.
Figure 24:
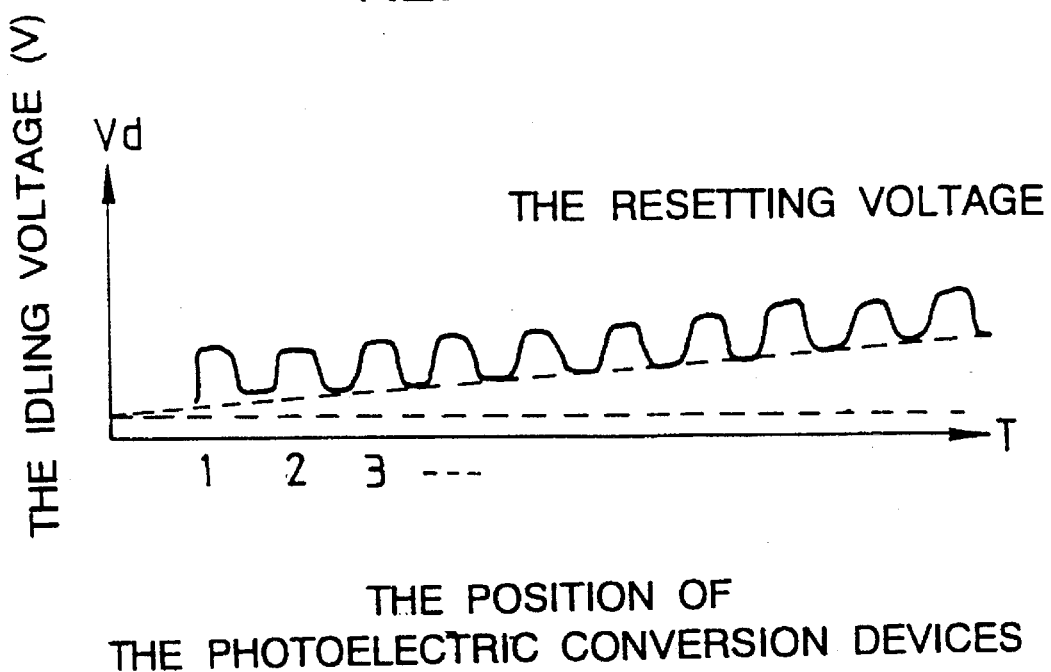
FIG. 24 illustrates the idling voltage measured using one sensor chip of the prior art.

1) Sensor chips 100a to 100n and capacitors 30 for the power supply are arranged on the multi-layered printed circuit board 17. In FIG. 7, capacitors 30 for the power supply are placed between the analog ground line $l_2$ and the $V_{DD}$ line for supplying power. The capacitors 30 for the power supply are used for absorbing noise in $V_{DD}$ line otherwise going into the analog ground line $l_2$. As shown in FIG. 7, an electric parts mounting area 31 is provided for mounting electric parts such as capacitor 6b and amplifier 6c (shown in FIG. 19) and resistors and capacitances. Also provided are connector lands (or connectors) 32 for interfacing with other circuits (not shown).

2) The multi-layered printed circuit board 17 has two internal insulator layers, i.e. a first insulator layer 22 and a second insulator layer 23, instead of the internal insulator layer 200 as shown in FIG. 2. The first insulator layer 22 is formed of a resin. The second insulator layer 23 is formed of different resin which has a different dielectric constant from that of the first insulator layer 22.

3) There are two analog ground lines $l_2$ and $l_2'$ as shown in FIG. 7. One analog ground line $l_2$ is placed in the first conductor layer 21, the same as shown in FIG. 2. This analog ground line $l_2$ extends over almost whole area of the first conductor layer 21. Another analog ground line $l_2'$ is placed in the second conductor layer 24 as shown in FIG. 7. These analog ground lines $l_2$ and $l_2'$ are connected through hole 28 as shown in FIG. 6. So these analog ground lines $l_2$ and $l_2'$ are able to work as one analog ground. The terminals $A_{GND}$ of the sensor chips 100a to 100n are connected with the analog ground line $l_2'$ in the second conductor layer 24. The analog ground line $l_2'$ is connected with the analog ground $l_2$, so that the distributed capacitance between the signal line $l_1$ and the analog ground $l_2$ in the first conductor layer 21 can be generated. The position of the through hole 28 is located between the analog ground lines $l_2$ and $l_2'$. Also, it is desirable to have many through holes 28 between them.

The reason why there are two internal insulator layers and analog ground lines $l_2$ and $l_2'$ in this multi-layered printed circuit board 17 will be described below. In order that the connection of the wire-bonding is improved, the second insulator layer 23 is preferably formed of acrylic resin. The analog ground line $l_2'$ is placed above the second insulator layer 23, so the connection of the wire-bonding with the analog ground line $l_2'$ of the second conductor layer 24 is improved.

The second insulator layer 23 not only insulates but also improves the connection of the wire-bonding. The first insulator layer 22 is primarily for insulating.

The second insulator layer 23 is preferably formed of acrylic resin. The resilience of acrylic resin improves the connection characteristics of the wire-bonding. Where better connection characteristics are not required, i.e. a ratio of inferior of the wire-bonding is 100 ppm and below, the insulator layer can consist of one layer, such as internal insulator layer 200 in embodiment 1, which is formed of a polyimide resin.

Figure 8:
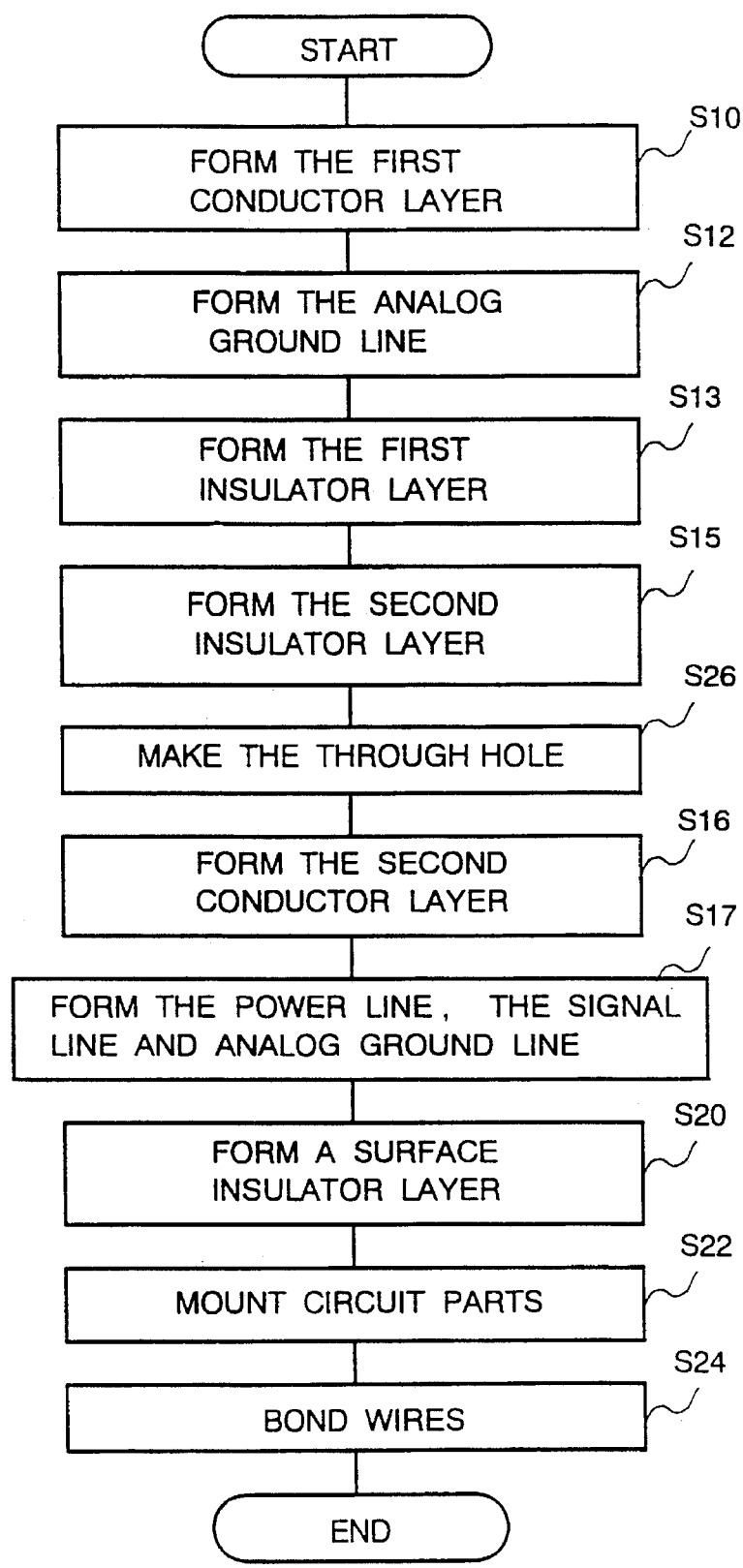
FIG. 8 is a flow diagram for a method of making the sensor board pursuant to the present invention.

FIG. 8 is a flow diagram which illustrating the method of making the sensor board 51 in accordance with the present invention.

In step S10, the first conductor layer 21 is formed on the substrate 20. The first conductor layer 21 is preferably formed of an electrolytic copper foil.

In step S12, the analog ground $l_2$ is formed. The analog ground $l_2$ is formed from the electrolytic copper foil on the first conductor layer 21.

In step S13, the first insulator layer 22 is formed next on the first conductor layer 21.

In step S15, the second insulator layer 23 is formed next on the first insulator layer 22.

In step S26, a through hole 28 is made between the analog ground $l_2$ in the first conductor layer 21 and analog ground line $l_2'$ in the second conductor layer 24.

In step S16, the second conductor layer 24 is formed next on the second insulator layer 23. The second conductor layer 24 is also preferably formed of an electrolytic copper foil.

In step S17, the analog ground line $l_2'$, the power line, the signal line $l_1$ and other lines are formed. These lines, the CLK line, the signal line $l_1$, the analog ground line $l_2'$, $V_{DD}$ line (the power line) and the SI line are formed of electrolytic copper foil on the second conductor layer 24 by chemical etching.

step S20, a surface insulator layer is formed next to the second conductor layer 24.

In step S22, circuit parts are mounted on the surface insulator layer 25.

In step S24, the wire bonding is performed.

The steps in FIG. 8 having the same numbers as used in FIG. 4 are the same and detailed explanations are therefore omitted for these steps.

In this embodiment, a printed-wiring board which is formed of a laminate layer of electrolytic copper foil on the substrate 20 is used as a base of the multi-layered printed circuit board 17. The laminate layer of the electrolytic copper foil is called the first conductor layer 21.

The analog ground $l_2$ is formed of electrolytic copper foil of the first conductor layer 21 by chemical etching. The analog ground $l_2$ is almost whole area of the first conductor layer 21 or a little bit smaller area than the whole area as shown in FIG. 7.

The first insulator layer 22 is formed of a polyimide resin, which is laminated on the above mentioned printed-wiring board.

The second insulator layer 23 is formed of acrylic resin, which is laminated on the first insulator layer 22. The acrylic resin improves the connection of the wire-bonding.

An electrolytic copper foil layer is laminated on the second insulator layer 23. This layer of electrolytic copper foil is called the second conductor layer 24.

The CLK line, the signal line $l_1$, the analog ground line $l_2'$, $V_{DD}$ line and the SI line are formed of electrolytic copper foil of the second conductor layer 24 by chemical etching. In FIGS. 6 and 7, the position of the lines is shown as one example. It should be understood that the SI line and the CLK line are changeable in their positions, and that other lines are also changeable in their positions.

The surface insulator layer 25 is formed next on the second conductor layer 24 by coating with a solder-resist for surface protection.

The thickness of the first insulator layer 22 is about 25 μm. The thickness of the second insulator layer 23 is about 15 μm.

The analog ground $l_2$ is placed in the first conductor layer 21, and the signal line $l_1$ is placed in the second conductor layer 24. There are insulator layers 22 and 23 between the first conduct layer 21 and the second conduct layer 24, so distributed capacitance Cd is generated between these lines $l_1$, $l_2$.

In the case of a printed-wiring board having a thickness of 0.3 mm and having a signal line and an analog ground placed at opposite sides thereof, the distributed capacitance is about 60 PF.

On the other hand, the thickness of the above multi-layered printed circuit board 17 of the present invention is about 25 μm+15 μm=40 μm, and the distributed capacitance is about 380 PF. The distributed capacitance is therefore greatly increased in the multi-layered printed circuit board 17 of the present invention.

The sensor board 51 also holds the circuit parts, for example the sensor chips 100a to 100n and the capacitors 30 for the power supply. These circuit parts are mounted on the multi-layered printed circuit board 17 and connected by gold wire 27.

Figure 9:
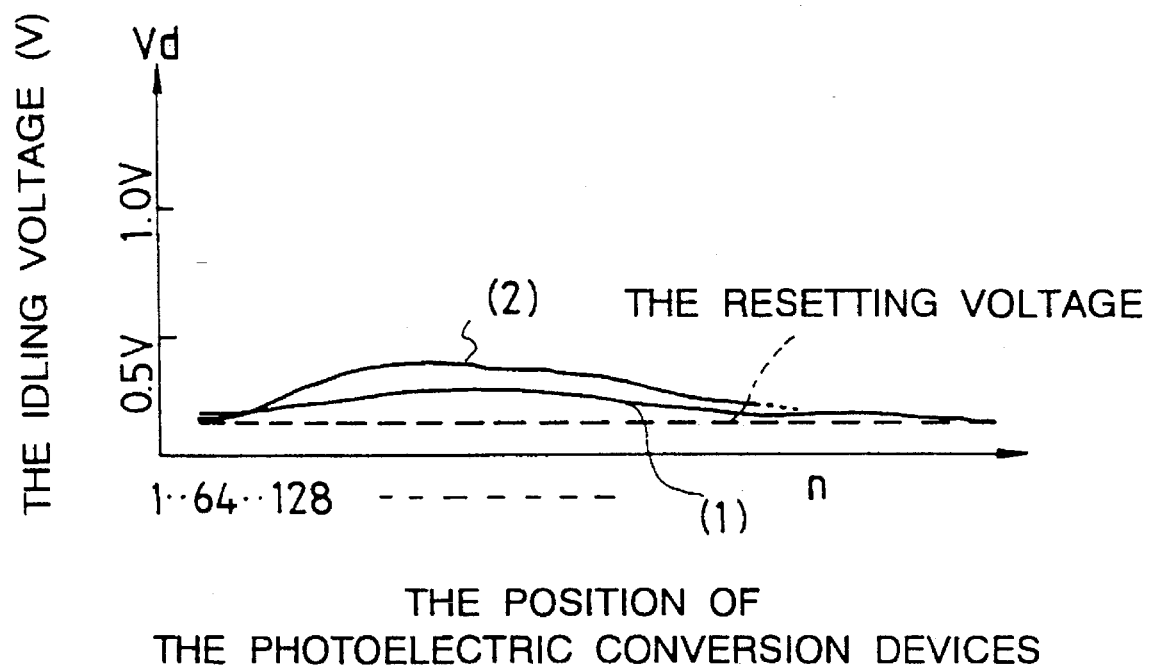
FIG. 9 illustrates the idling voltage measured using the sensor board of the embodiment of FIG. 6.

FIG. 9 illustrates the measured idling voltage for the sensor board 51 of this embodiment.

On the vertical axis in FIG. 9, values of the idling voltage Vd are indicated. The horizontal axis indicates the position of the photoelectric conversion devices in the sensor board 51. The dotted line shows the voltage when the sensor board 51 is reset.

Figure 25:
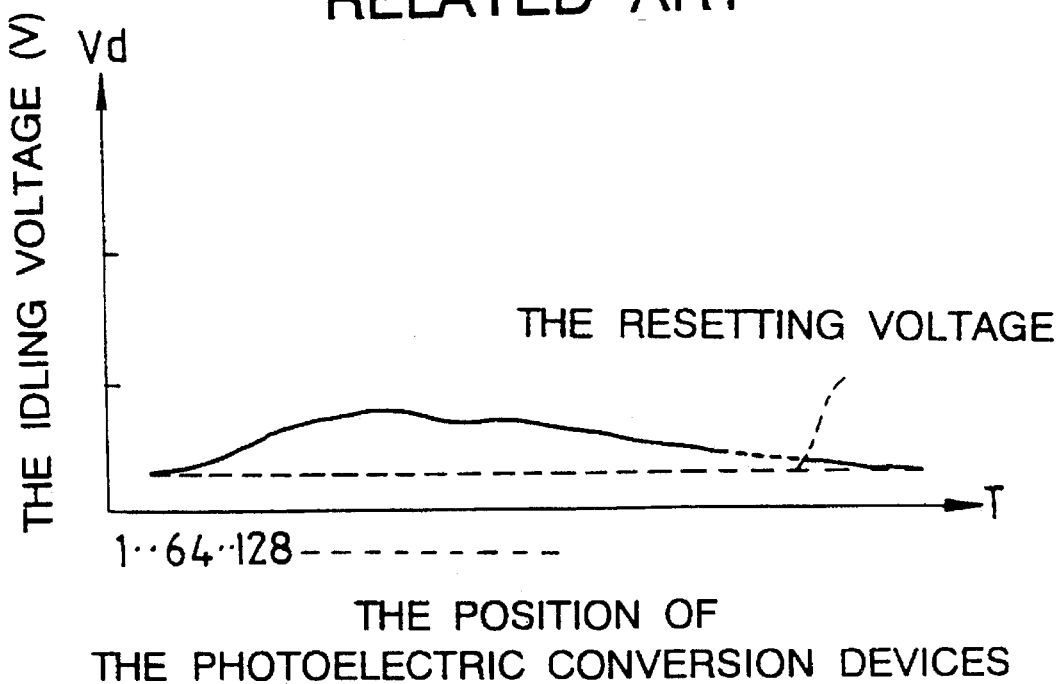
FIG. 25 illustrates the idling voltage measured using the conventional CIS which contains a plurality of sensor chips of the prior art.

The curve (1) is the idling voltage measured for the sensor board 51 of the present invention. The curve (2) is the idling voltage as shown in FIG. 25 for the prior art. Comparing curve (1) with curve (2), it is seen that the idling voltage of the sensor board 51 of the present invention is reduced by a large margin.

In the CIS of this embodiment using the above multi-layered printed circuit board 17, the total thickness of the first insulator layer 22 and the second insulator layer 23 is about 40 μm. Therefore, the distributed capacitance generated both lines $l_1$, $l_2$ is 380 PF. This is much larger than the distributed capacitor (60 PF) of the prior art printed-wiring board. The main reason is that the thickness "d" of the insulator layer (e.g., the layer 200 in FIG. 2 or the combined layers 22 and 23 in FIG. 7) is smaller than the prior art printed-wiring board. The following formula (2) is for distributed capacitance:

$$C = K_1 \times \gamma \epsilon \times \gamma \times s/d \qquad (2)$$

C: distributed capacitance
γε: relative permittivity of the board
$k_1$: constant
d: thickness of the insulator layer
s: facing area The distributed capacitance becomes much larger according to the present invention. The high-frequency noise which is generated mainly by the switching of the analog switches 15a to 15n, 11a to 11n and 10a to 10n decreases and the idling voltage goes down.

Embodiment 3

In this embodiment, the insulator layer is a mixed substance which is of a high permittivity. The increased relative permittivity of the insulator layer increases the distributed capacitance, and therefore the idling voltage becomes even lower.

In this embodiment, the substance which has a high permittivity is barium titanate.

Figure 10:
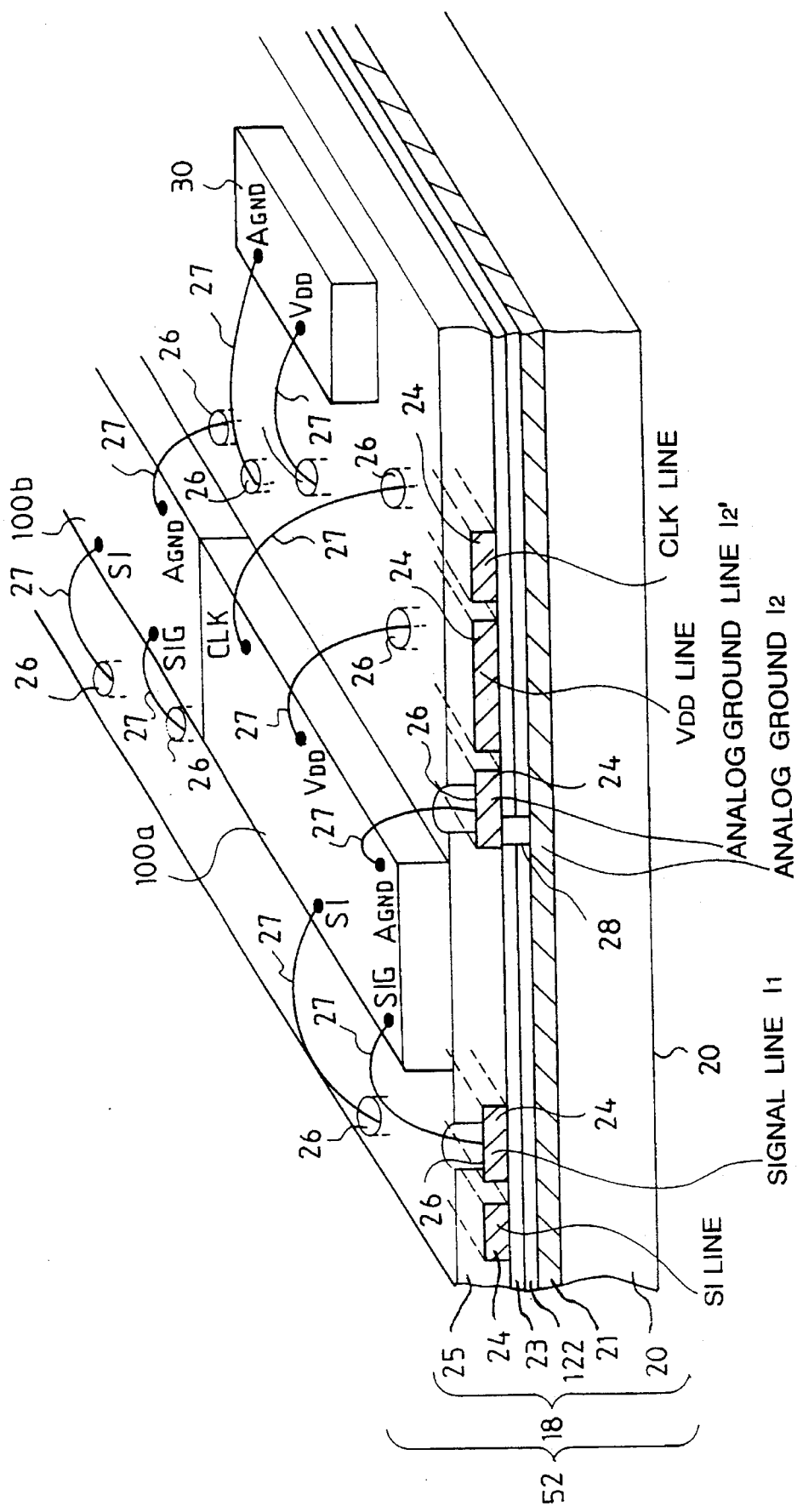
FIG. 10 illustrates a further sectional and perspective view of the sensor board of another embodiment.

FIG. 10 illustrates a sectional and perspective view of a sensor board 52 of the third embodiment.

A multi-layered printed circuit board 18 forms the base of the sensor board 52. The first insulator layer is formed of a powder of polyimide resin mixed with a powder of barium titanate. The mixing ratio of the polyimide resins to the barium titanate is 50 (wt %): 50 (wt %).

Other elements FIG. 10 are the same as those in FIG. 6 of embodiment 2. In FIG. 10, the position of the lines is shown only as an example. For example, the SI line and the CLK line can be changed their position, and the positions of other lines can also be changed.

The multi-layered printed circuit board 18 is almost same as the multi-layered printed circuit board 17 in embodiment 2. However, the first insulator layer 122 is formed using a different forming process. The different process will be described below.

A printed-wiring board which is laminated with an electrolytic copper foil on the substrate 20 is used.

The first insulator layer 122 is formed of a mixture of a polyimide resins and a powder of barium titanate and is laminated on the above printed-wiring board.

The second insulator layer 23 is formed of an acrylic resin and laminated on the first insulator layer 122.

The thickness of the first insulator layer 122 is about 25 μm. The thickness of the second insulator layer 23 is about 15 μm.

The analog ground $l_2$ is placed in the first conductor layer 21, and the signal line $l_1$ is placed on the second conductor layer 24. A distributed capacitance is generated between the signal line $l_1$ and the analog ground $l_2$.

The distributed capacitance of the multi-layered printed circuit board 18 is about 1830 PF.

The sensor board 52 also holds the circuit parts, for example, sensor chips 100a to 100n and capacitors 30 mounted on the multi-layered printed circuit board 18. The circuit parts are interconnected with gold wire 27.

Figure 11:
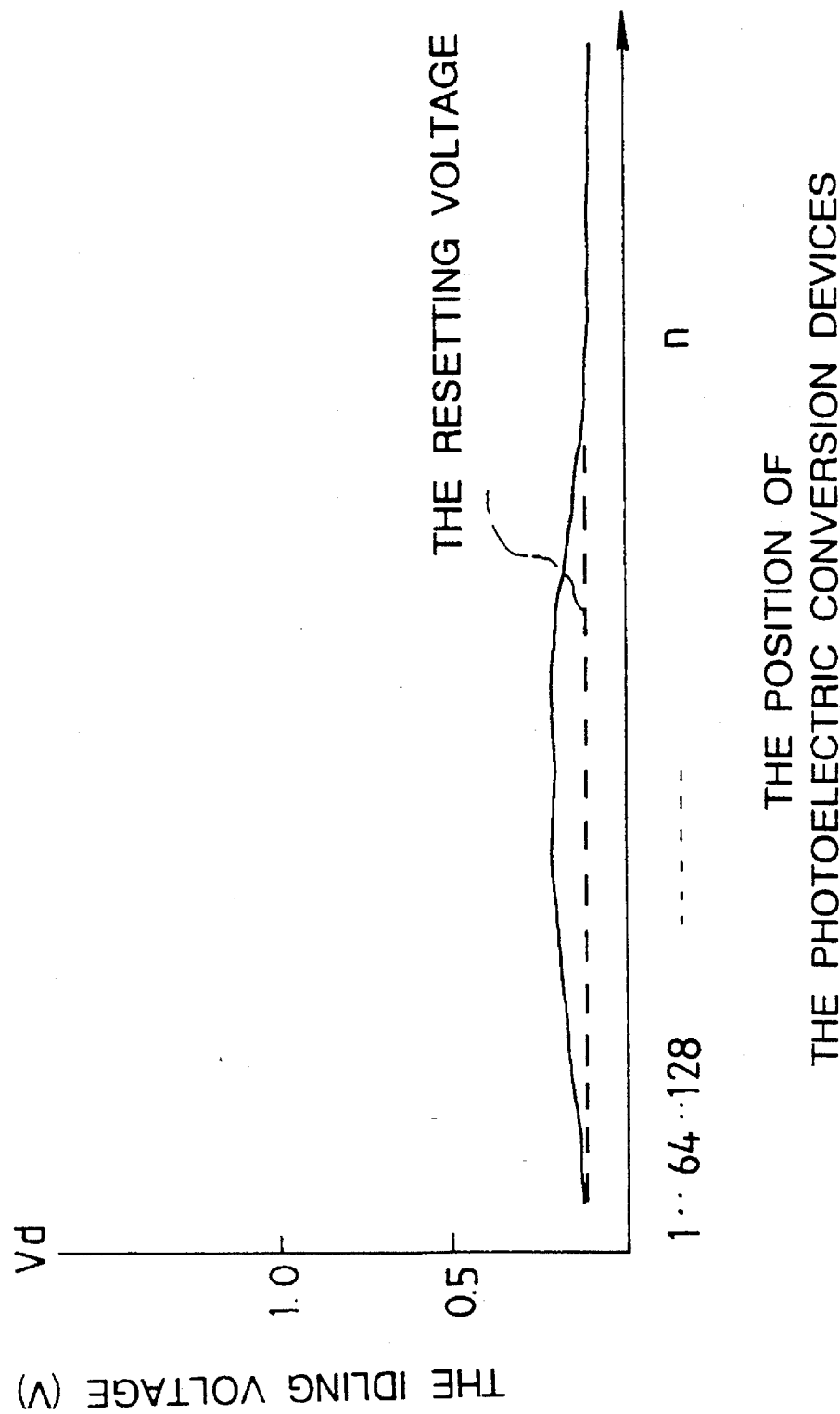
FIG. 11 illustrates the idling voltage measured using the sensor board of the embodiment of FIG. 10.

The idling voltage was measured for the sensor board 52. The result is illustrated in FIG. 11.

The idling voltage for sensor board 52 is lower than that shown in FIG. 9 for embodiment 2 as a whole.

The following explains the reason why the idling voltage for sensor board 52 is lower than that of embodiment 2 as a whole.

As shown in formula (2), the distributed capacitance depends on the relative permittivity of the insulator layer. The relative permittivity $\epsilon\gamma$ of the insulator layer 122 which includes barium titanate is 800. On the other hand, the relative permittivity $\epsilon\gamma$ of an acrylic resin or polyimide resins is about 3 to 3.5.

Because the insulator layer 122 is made by mixing the powder of polyimide resins with the powder of barium titanate, the relative permittivity of insulator layer 122 is greatly increased. As a result, the distributed capacitance between the signal line $l_1$ and the analog ground $l_2$ is increased to 1830 PF. Therefore the noise of the signal line $l_1$ is absorbed more by the analog ground $l_2$, which is the reason why the idling voltage becomes lower.

The same effect is attained when the insulator layer high permittivity is attained in other ways instead of by mixing barium titanate with the insulator material.

Embodiment 4

The object of this embodiment is to remove the fluctuation of the idling voltage.

The above embodiments describe the noise which occurs within sensor chips 100a to 100n. There is also another source of the noise. The noise in the signal line $l_1$ also comes from the power line.

Figure 13:
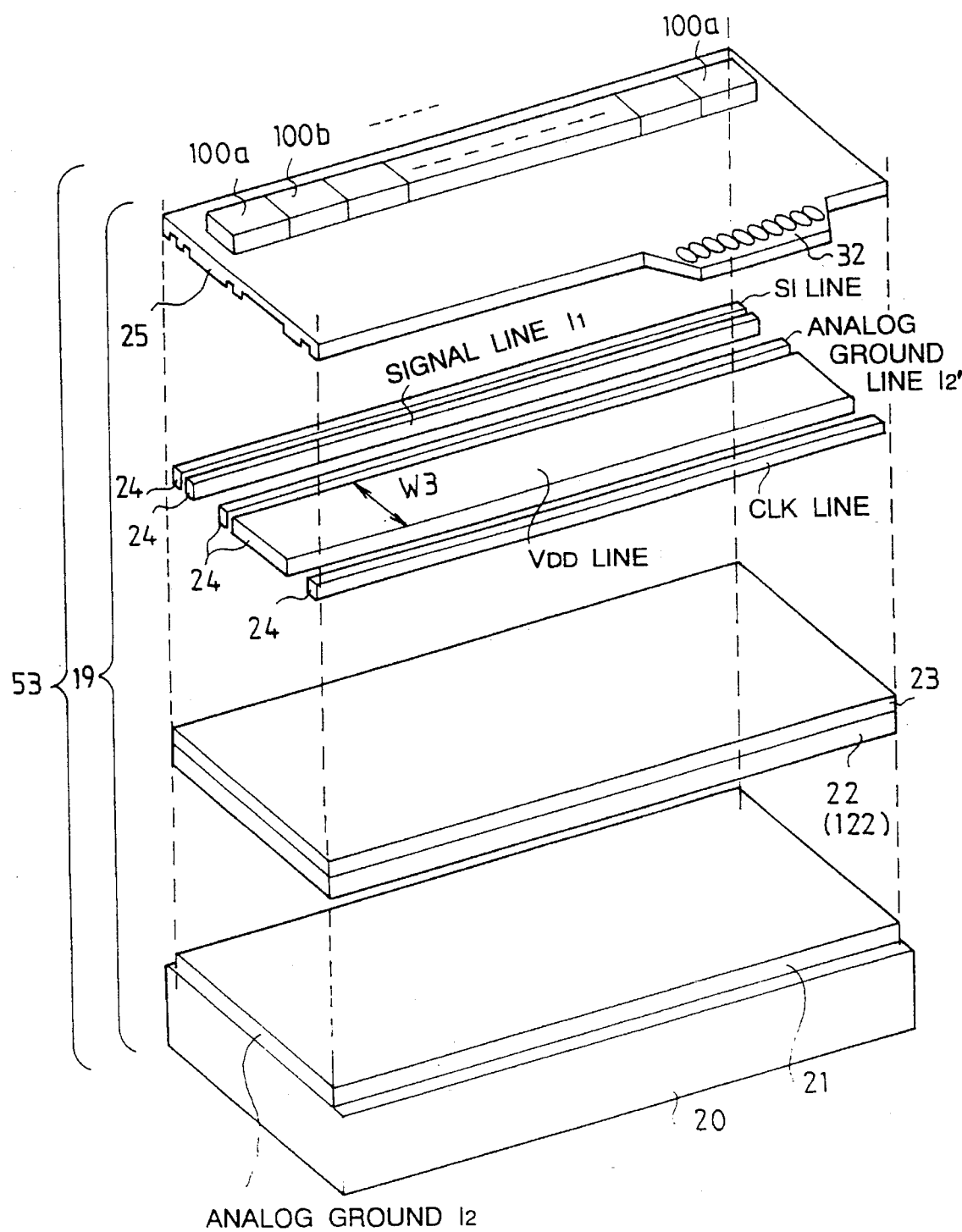
FIG. 13 illustrates a exploded view of the sensor board of another embodiment.

Therefore, the power line ($V_{DD}$ line) and the signal line $l_1$ are placed in the second conductor layer 24 as shown in FIG. 13. The analog ground $l_2$ is placed in the first conductor layer 21. The width of the power line is uniform and of a wide size. The result is that the distributed capacitance Cp is generated between the power line and the analog ground $l_2$.

At first the problem of the embodiment 2 will be described below.

FIG. 7 is a exploded view of the sensor board 51.

In FIG. 7, capacitors 30 for the power supply are placed between the analog ground line $l_2'$ and the $V_{DD}$ line for supplying power. The capacitors 30 for the power supply are used for absorbing noise in $V_{DD}$ line otherwise coming into the analog ground line $l_2'$. An electric parts mounting area 31 is provided for mounting electric parts such as capacitor 6b and amplifier 6c (shown in FIG. 19). Also provided are connector lands (or connectors) 32 for interfacing with other circuits (not shown).

Figure 12:
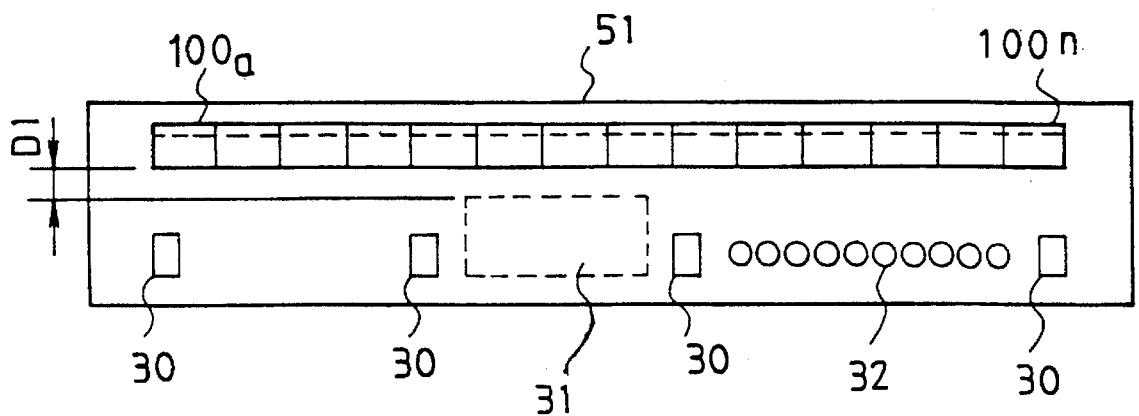
FIG. 12 illustrates a top plan view of the sensor board of the second embodiment.

FIG. 12 is a top plan view of the sensor board 51 in embodiment 2. D1 is the distance between sensor chips 100a to 100n and the electric parts mounting area 31. In FIG. 12, D1 is 3 mm.

As shown in FIG. 7, $V_{DD}$ line is placed in the second conductor layer 24 of the multi-layered printed circuit board 17. The analog ground $l_2$ is placed in the first conductor layer 21. So the distributed capacitance Cp is generated between the $V_{DD}$ line and the analog ground $l_2$.

The distributed capacitance Cp between the $V_{DD}$ line and the analog ground $l_2$ is expressed by the formula (2), $$Cp = K_1 \times \epsilon\gamma \times s/d \qquad (2)$$

Cp: distributed capacitance
$\epsilon\gamma$: relative permittivity of the board
$k_1$: constant
d: thickness of the insulator layer
s: facing area Among these physical factors, the facing area "s" is most important parameter in this case.

As shown in FIG. 7, the width of the $V_{DD}$ line is changed, from W1 to W2 and W2 to W1, in order to avoid the electric parts mounting area 31. Usually there are various electric parts on the sensor board, so the $V_{DD}$ line is designed to avoid these electric parts. Therefore the width of $V_{DD}$ line varies as shown. This means that the facing area "s" changes at the electric parts mounting area location. The distributed capacitance Cp between the $V_{DD}$ line and the analog ground $l_2$ is therefore not constant along the length of the $V_{DD}$ line.

The power source noise in the signal line $l_1$ comes from the $V_{DD}$ line. In this case the capacitors 30 for the power supply and the distributed capacitance Cp absorb noise from $V_{DD}$ line otherwise coming into the analog ground $l_2$. The noise is heavily absorbed at locations where the capacitors 30 are placed. The idling voltage thus becomes lower at locations where the capacitors 30 are placed. The idling voltage is still higher at locations away from the capacitors 30.

The noise is also absorbed and the idling voltage becomes lower in the location where the width of the $V_{DD}$ line is wide, i.e. where the width is W1, because the distributed capacitance Cp is larger where the facing area "s" is larger. The idling voltage is higher in the location where the width of the $V_{DD}$ line is narrow, i.e. where the width is W2, because the distributed capacitance Cp is smaller where the facing area "s" is smaller.

This causes fluctuations of the idling voltage shown as in FIG. 9, i.e. the curve (1) is in the form of a low hill.

The sensor board 53 improves the above problem and will now be described.

FIG. 13 is a exploded view of the sensor board 53 which is designed for removing the fluctuations of the idling voltage.

A multi-layered printed circuit board 19 comprises a substrate 20, a first conductor layer 21, a first insulator layer 22, a second insulator layer 23, a second conductor layer 24, and a surface insulator layer 25. The multi-layered printed circuit board 19 is the base of the sensor board 53. The sensor chips 100a to 100n are mounted on the multi-layered printed circuit board 19 to form the sensor board 53. However a first insulator layer 122 formed of a composite material as described above can be used instead of the first insulator layer 22 as an alternative.

FIG. 8 is a flow diagram which illustrates the method of making the sensor board 53 in accordance with the present invention.

A principal difference between sensor board 51 and sensor board 53 is the shape of the $V_{DD}$ line and circuit parts which are mounted on the sensor board. Therefore, the process of making the sensor board 53 is same as the sensor board 51.

The analog ground line $l_2'$ is formed of electrolytic copper foil by chemical etching of the second conductor layer 24. And the analog ground $l_2$ is formed of electrolytic copper foil by chemical etching of the first conductor layer 21, as shown in FIG. 7. However only the analog ground $l_2$ can be placed on the first conductor layer 21, as shown in FIG. 3 as an alternative.

The $V_{DD}$ line, the signal line $l_1$, the SI line, the CLK line and the analog ground line $l_2'$ are formed of electrolytic copper foil by chemical etching of the second conductor layer 24.

Figure 14:
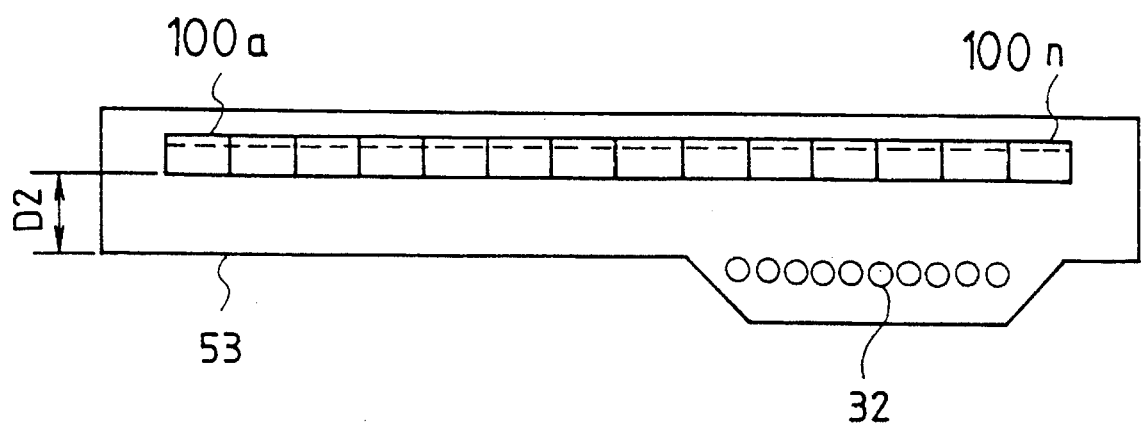
FIG. 14 illustrates a top plan view of the sensor board of the embodiment of FIG. 13.

FIG. 14 is a top plan view of the sensor board 53. In this embodiment, there is no electric parts mounting area (such as 31 in FIG. 12). And there are no capacitors 30 for the power supply in this embodiment. In this embodiment the electric parts are mounted on another board (not shown).

D2 is the distance from the connector lands 32 to the sensor chips 100a to 100n. D2 is about 7 mm in this embodiment and is larger than D1 (3 mm).

The $V_{DD}$ line can be formed under the D2 area on the second conductor layer 24.

The width of the $V_{DD}$ line is W3 as shown in FIG. 13. W3 is less than D2. The width of the $V_{DD}$ line can thus be constant and relatively wide, because there are no capacitors 30 and no electric parts mounting area 31 on the sensor board 53 as shown in FIG. 14. The larger W3 dimension means that a larger facing area "s" can be provided, which means that the distributed capacitance Cp is larger. In FIG. 13, the positions shown for the SI line, the signal line $l_1$, the analog ground line $l_2'$, the $V_{DD}$ line and the CLK line are shown by way of example. For example, the locations of the SI line and the CLK line can be changed. The locations of other lines can also be changed. And if the CLK line is moved to the side of the SI line, the width of the $V_{DD}$ line can make larger than W3.

However, there is a limitation on the board size and D2 is therefore selected at about 7 mm in this embodiment.

The electric parts may also be mounted on the sensor board 53. These electric parts should be mounted to keep the same distance D2 from the sensor chips 100a to 100n. In this alternative embodiment, a wider $V_{DD}$ line of constant width may also be realized.

Figure 15:
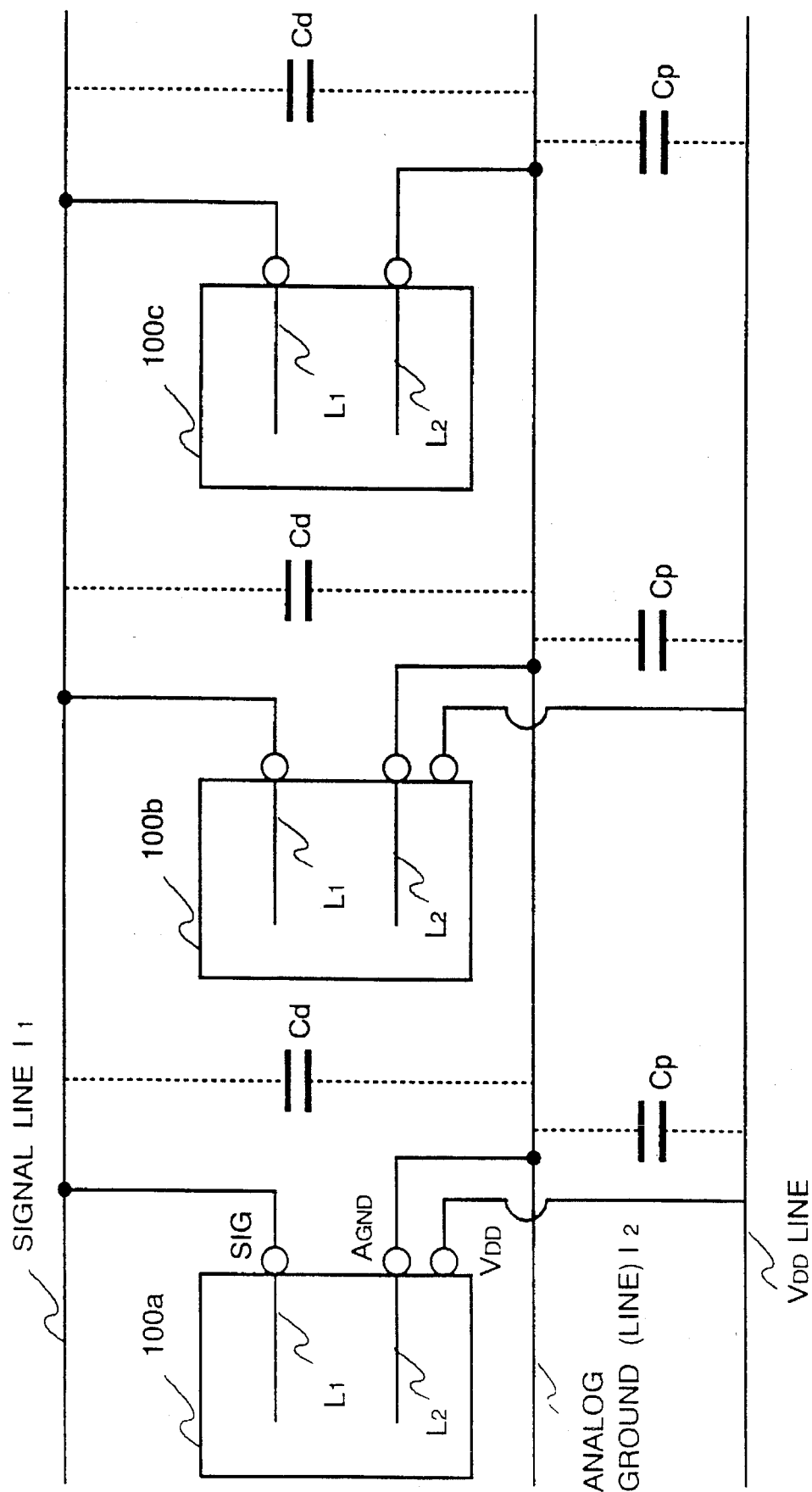
FIG. 15 illustrates a schematic block diagram of the embodiment of FIG. 13 which means that the internal high-frequency noise generated in the sensor chips is absorbed by the external distributed capacitance and the high-frequency noise generated by the power line is absorbed by the other distributed capacitance generated by the external signal line and the external power line.

FIG. 15 is a schematic block diagram of this further embodiment. The distance between the $V_{DD}$ line and the analog ground $l_2$ is made uniform, and the width of the $V_{DD}$ line is also made uniform. This results in uniform distribution of the distributed capacitance Cp generated between the $V_{DD}$ line and the analog ground $l_2$ as shown in FIG. 15.

The noise which occurs within sensor chips 100a to 100n is absorbed by the distributed capacitance Cd which is generated between the signal line $l_1$ and the analog ground $l_2$. The noise which comes from the $V_{DD}$ line is absorbed by the distributed capacitance Cp which is generated between the $V_{DD}$ line and the analog ground $l_2$. The width of the $V_{DD}$ line can be constant, so the distributed capacitance Cp is the same level of capacitance at every point along the line as shown in FIG. 15.

Figure 16:
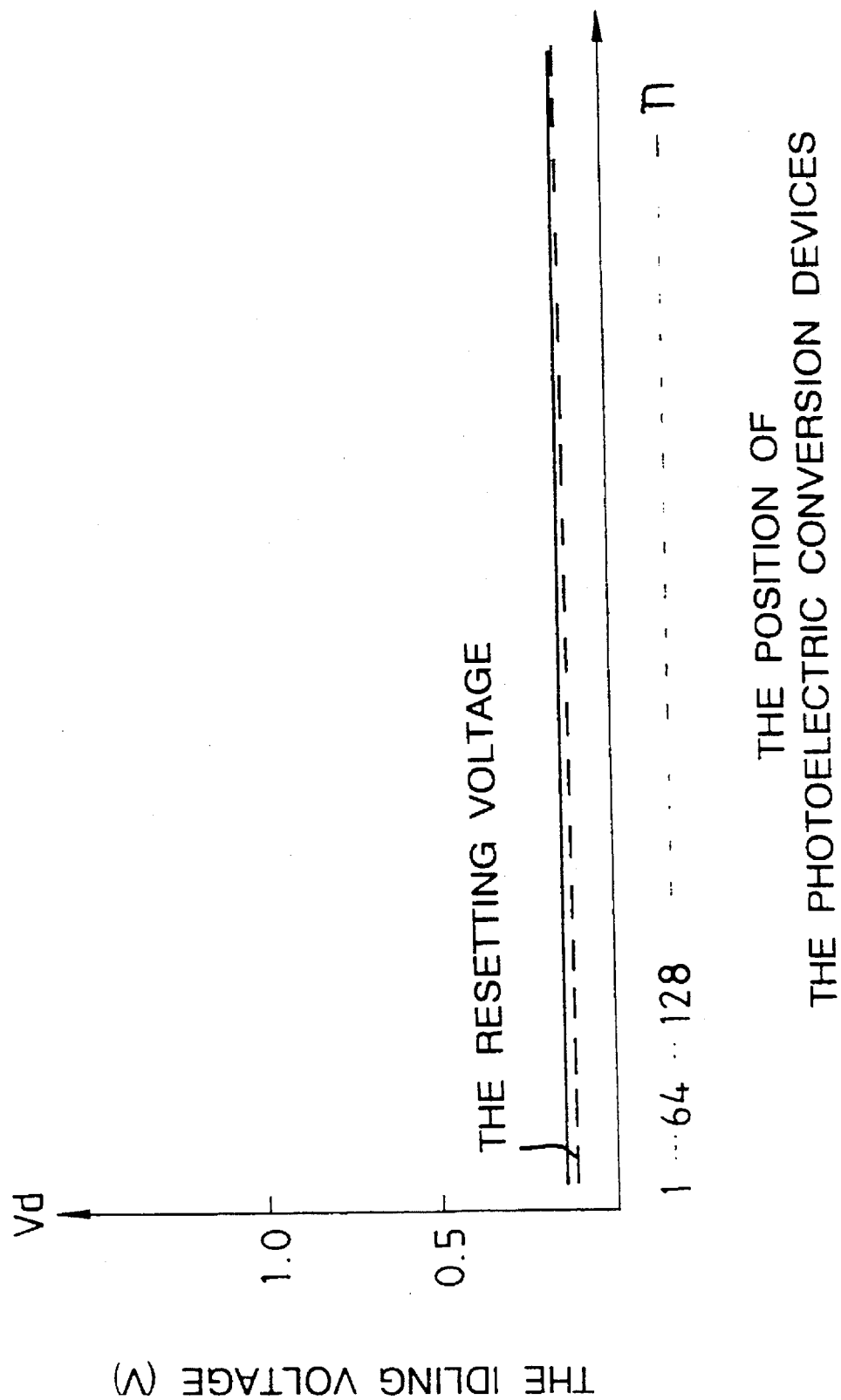
FIG. 16 illustrates the idling voltage measured using the sensor board of the embodiment of FIG. 13.

FIG. 16 illustrates the idling voltage measured using the sensor board 53. The dotted line shows the voltage when the sensor board 53 is reset. The solid line shows the idling voltage of the sensor board 53.

It will be observed that the idling voltage is almost the same as the resetting voltage.

As described above, the $V_{DD}$ line is placed on the second conductor layer 24 and the analog ground $l_2$ is placed on the first conductor layer 21. There are insulator layers 22, 23 of constant thickness between the first conductor layer 21 and the second conductor layer 24. Therefore, the distance between the $V_{DD}$ line and the analog ground $l_2$ is substantially constant. The width of the $V_{DD}$ line is also constant as explained above.

A uniform the distribution of the distributed capacitance Cp is thus provided. This is the reason why the idling voltage is almost the same as the resetting voltage, i.e. the idling voltage is equal between adjacent photoelectric conversion devices.

Also the width of the $V_{DD}$ line remains wide along its entire length, so the distributed capacitance Cp increases, which means the noise in $V_{DD}$ line is absorbed more efficiently. This is the reason why the idling voltage is lower.

Moreover, since the greater width of the $V_{DD}$ line provides a larger distributed capacitance Cp, the capacitors 30 for the power supply can be omitted. Therefore, the production cost is reduced by decreasing the number of electric parts.

Embodiment 5

In embodiment 4 described above, the $V_{DD}$ line is placed on the second conductor layer 24 and the analog ground $l_2$ is placed on the first conductor layer 21. However, in an alternative embodiment the $V_{DD}$ line can be placed on the first conductor layer 21 and the analog ground $l_2$ can be placed on the second conductor layer 24.

In embodiment 4, D2 is designed to be about 7 mm. However, the larger the dimension D2, the larger the distributed capacitance Cp. Therefore, if possible, D2 should be designed to be substantially greater than 7 mm.

Embodiment 6

The above embodiments describe that the insulator layer can be either one or two layers. However, the insulator layer can be formed of three layers or more. The plurality of three or more insulator layers can be made of different materials. Also, each of the insulator layers can be formed of a mix of different materials having different dielectric constants.

Figure 17:
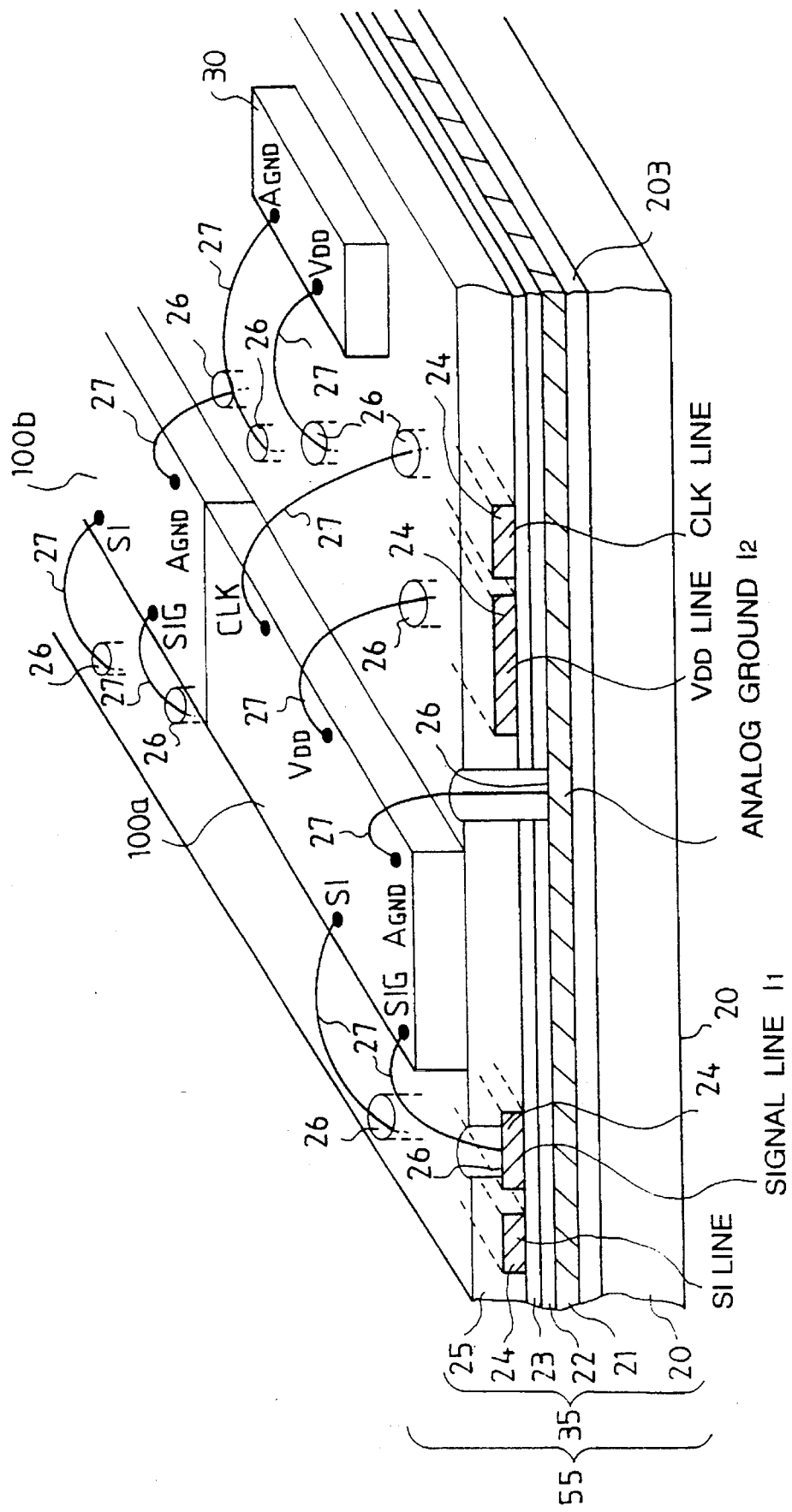
FIG. 17 illustrates a sectional and perspective view of the sensor board of still another embodiment.

FIG. 17 shows an embodiment having three insulator layers.

FIG. 17 illustrates a sectional drawing of a sensor board 55 which has 3 insulator layers 22, 23, and 203.

The internal insulator layer is divided into two insulator layers, such as the first insulator 22 and the second insulator layer 23. A third insulator layer 203 is placed under the first conductor layer 21. The insulator layer 203 and the second insulator layer 23 are preferably formed of acrylic resin. The resilience of acrylic resin improves the connection characteristics of the wire-bonding in the first conductor layer 21 and the second conductor layer 24. There is only one analog ground $l_2$ located in the first conductor layer 21. However, the connection characteristic of the wire-bonding of the analog ground $l_2$ is improved.

Having thus described several particular embodiments of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only, and not intended to be limiting. The invention is limited only as defined in the following claims and the equivalents thereto.

What is claimed is:

1. An image sensor comprising:

a plurality of sensor chips for sensing an image and outputting a signal to form a part of a parallel signal, wherein each of the sensor chips has a plurality of photoelectric conversion devices, an internal signal line coupled to the plurality of photoelectric conversion devices, an internal ground line coupled to the plurality of photoelectric conversion devices and a plurality of switches for coupling the signal line and the ground line;

a printed circuit board for mounting the plurality of sensor chips thereon and for forming a signal circuit wherein the signal circuit receives the parallel signal from the plurality of sensor chips, converts the parallel signal to a serial signal, and outputs the serial signal;

wherein the printed circuit board has a substrate as a base, a first conductor layer placed on one side of the substrate, having an external ground line coupled to the internal signal line, a second conductor layer having an external signal line coupled to the internal signal line, and an insulator layer between the first and the second conductor layers for creating a capacitance between the external signal line and the external ground line.

2. The image sensor of claim 1, wherein the second conductor layer includes a power line for supplying power.

3. The image sensor of claim 1, further comprising other circuit parts, wherein the other circuit parts are mounted on the printed circuit board in an area spaced apart from the power line and the ground line.

4. The image sensor of claim 1, wherein the insulator layer has first and second insulator layers formed of different compositions of materials.

5. The image sensor of claim 4, wherein the first insulator layer includes a resin which has a high permittivity.

6. A multi-layered printed circuit board comprising:

a substrate;

a first conductor layer placed on one side of the substrate for providing a ground;

a second conductor layer for providing a signal line;

an insulator layer located between the first and the second conductor layers for creating a capacitance between the signal line and the ground;

a surface insulator layer; and a circuit mounted on the surface insulator layer having a plurality of chips electrically coupled to the signal line and the ground.

7. The multi-layered printed circuit board of claim 6, wherein the second conductor layer includes a power line for supplying power.

8. The multi-layered printed circuit board of claim 7, wherein the insulator layer includes a plurality of sub-insulator layers.

9. The multi-layered printed circuit board of claim 8, wherein each of the plurality of sub-insulator layers is formed of a different composition of material.

10. The multi-layered printed circuit board of claim 9, wherein the circuit is connected to the signal line on the second conductor layer with a wire, and wherein one of the sub-insulator layers adjacent to the second conductor layer includes a substance which improves a characteristic of a wire bounding with the signal line.

11. The multi-layered printed circuit board of claim 10, wherein the substance comprises an acrylic resin.

12. The multi-layered printed circuit board of claim 6, wherein the insulator layer includes a high permittivity substance.

13. The multi-layered printed circuit board of claim 12, wherein the high permittivity substance includes barium titanate.

14. The multi-layered printed circuit board of claim 7, wherein the signal line and the power line face to the ground across the insulator layer, and wherein the facing area between the power line and the ground is larger than the facing area between the signal line and the ground.

15. The multi-layered printed circuit board of claim 7, wherein the power line has a constant width.

16. The multi-layered printed circuit board of claim 6, wherein the circuit includes a photosensor, and wherein the multi-layered printed circuit board functions as an image sensor.

17. The multi-layered printed circuit board of claim 6, wherein the second conductor layer includes a ground line coupled to the ground.

18. A method for manufacturing a board, comprising the steps of:

forming a first conductor layer;

forming a ground on the first conductor layer by chemical etching;

forming an internal insulator layer next to the first conductor layer;

forming a second conductor layer next to the insulator layer;

forming a signal line on the second conduct layer by chemical etching;

forming a surface insulator layer next to the second conductor layer;

mounting chips on the surface insulator layer; and electrically coupling the chips to the signal line and ground.

19. The method of claim 18, wherein the internal insulator layer forming step includes the steps of forming a first insulator layer, and forming a second insulator layer having a material composition different from that of the first insulator layer.

20. The method of claim 19, wherein the first insulator layer forming step includes the step of mixing a high permittivity substance and a resin.

21. The method of claim 19, wherein the second insulator layer is formed of an acrylic resin.

22. The method of claim 18, wherein the second conductor layer forming step includes the step of forming a power line on the second conduct layer.

* * * * *